(12) United States Patent
Wu et al.

(10) Patent No.: US 12,388,028 B2
(45) Date of Patent: Aug. 12, 2025

(54) PACKAGE STRUCTURE

(71) Applicant: Taiwan Semiconductor Manufacturing Company, Ltd., Hsinchu (TW)

(72) Inventors: Yi-Wen Wu, New Taipei (TW); Shin-Puu Jeng, Hsinchu (TW); Shih-Ting Hung, New Taipei (TW); Po-Yao Chuang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/740,503

(22) Filed: Jun. 11, 2024

(65) Prior Publication Data
US 2024/0332211 A1 Oct. 3, 2024

Related U.S. Application Data

(63) Continuation of application No. 18/359,902, filed on Jul. 27, 2023, now Pat. No. 12,051,654, which is a
(Continued)

(51) Int. Cl.
H01L 23/552 (2006.01)
H01L 21/48 (2006.01)
(Continued)

(52) U.S. Cl.
CPC ........ *H01L 23/552* (2013.01); *H01L 21/4857* (2013.01); *H01L 21/568* (2013.01);
(Continued)

(58) Field of Classification Search
CPC .. H01L 23/552; H01L 21/4857; H01L 21/568
See application file for complete search history.

(56) References Cited

U.S. PATENT DOCUMENTS 9,000,584 B2 4/2015 Lin et al.
9,048,222 B2 6/2015 Hung et al.
(Continued)

Primary Examiner — Errol V Fernandes
(74) Attorney, Agent, or Firm — JCIPRNET

(57) ABSTRACT

A package structure includes a redistribution structure, a first semiconductor die, a first passive component, a second semiconductor die, a first insulating encapsulant, a second insulating encapsulant, a second passive component and a global shielding structure. The redistribution structure includes dielectric layers and conductive layers alternately stacked. The first semiconductor die, the first passive component and the second semiconductor die are disposed on a first surface of the redistribution structure. The first insulating encapsulant is encapsulating the first semiconductor die and the first passive component. The second insulating encapsulant is encapsulating the second semiconductor die, wherein the second insulating encapsulant is separated from the first insulating encapsulant. The second passive component is disposed on a second surface of the redistribution structure. The global shielding structure is surrounding the first insulating encapsulant, the second insulating encapsulant, and covering sidewalls of the redistribution structure.

20 Claims, 23 Drawing Sheets

Related U.S. Application Data continuation of application No. 17/717,165, filed on Apr. 11, 2022, now Pat. No. 11,804,451, which is a continuation of application No. 16/921,907, filed on Jul. 6, 2020, now Pat. No. 11,302,650.

(60) Provisional application No. 62/964,034, filed on Jan. 21, 2020.

(51) Int. Cl.
| | |
|---|---|
| *H01L 21/56* | (2006.01) |
| *H01L 23/31* | (2006.01) |
| *H01L 23/538* | (2006.01) |
| *H01L 25/00* | (2006.01) |
| *H01L 25/16* | (2023.01) |

(52) U.S. Cl.
CPC ...... *H01L 23/3121* (2013.01); *H01L 23/3135* (2013.01); *H01L 23/5383* (2013.01); *H01L 25/165* (2013.01); *H01L 25/50* (2013.01)

(56) References Cited

U.S. PATENT DOCUMENTS

| | | | |
|---|---|---|---|
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2016/0270213 | A1* | 9/2016 | Salehi .............. B33Y 80/00 |
| 2019/0244946 | A1* | 8/2019 | Kim .............. H01L 23/552 |

* cited by examiner

PACKAGE STRUCTURE

CROSS-REFERENCE TO RELATED APPLICATION

This application is a continuation application of and claims the priority benefit of U.S. application Ser. No. 18/359,902, filed on Jul. 27, 2023, now allowed. The prior application Ser. No. 18/359,902 is a continuation application of and claims the priority benefit of U.S. application Ser. No. 17/717,165, filed on Apr. 11, 2022, now patented as U.S. Pat. No. 11,804,451, issued on Oct. 31, 2023. The prior application Ser. No. 17/717,165 is a continuation application of and claims the priority benefit of U.S. application Ser. No. 16/921,907, filed on Jul. 6, 2020, now patented as U.S. Pat. No. 11,302,650, issued on Apr. 12, 2022, which claims the priority benefit of U.S. provisional application Ser. No. 62/964,034, filed on Jan. 21, 2020. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
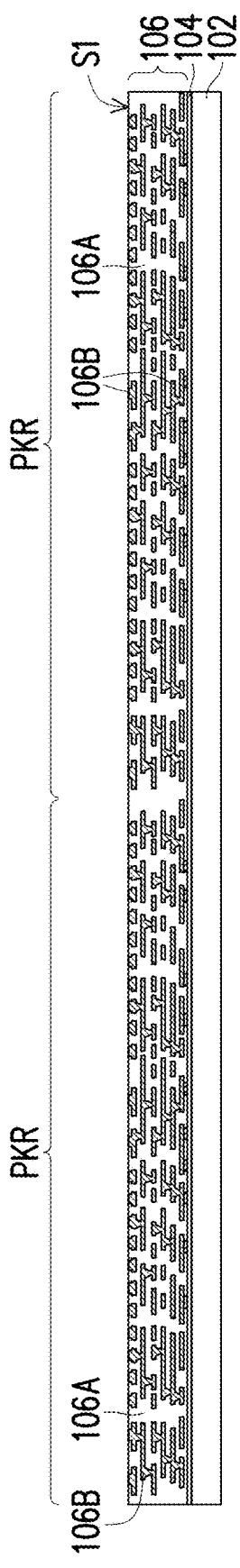
FIG. 1 to FIG. 11 are schematic sectional and top views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In conventional system-in-package (SiP) structures, a thick substrate layer is generally used as an interconnection layer, a shape of the insulating encapsulant is generally fixed, and there is also a lack of compartment shielding between the semiconductor dies located therein. As such, the design of the package structure is very limited, and the overall thickness of the package structure is also increased. The insulating encapsulant also occupies a larger volume, giving a larger warpage to the package structure. It is desired to increase the flexibility in the design of the package structure to provide a system-in-package (SiP) having smaller thicknesses, less warpage and with better device performance.

FIG. 1 to FIG. 11 are schematic sectional and top views of various stages in a method of fabricating a package structure according to some exemplary embodiments of the present disclosure.

Referring to FIG. 1, a carrier 102 is provided. In some embodiments, the carrier 102 is a glass carrier or any suitable carrier for carrying a semiconductor wafer or a reconstituted wafer for the manufacturing method of the package structure. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 includes a dielectric material layer made of a dielectric material including any suitable polymer-based dielectric material (such as benzocyclobutene ("BCB"), polybenzoxazole ("PBO")). In an alternative embodiment, the debond layer 104 includes a dielectric material layer made of an epoxy-based thermal-release material, which loses its adhesive property when heated, such as a light-to-heat-conversion (LTHC) release coating film. In a further alternative embodiment, the debond layer 104 includes a dielectric material layer made of an ultra-violet (UV) glue, which loses its adhesive property when exposed to UV lights. In certain embodiments, the debond layer 104 is dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and the top surface of the buffer layer may further provide a high degree of coplanarity. In some embodiments, the buffer layer is a dielectric material layer. In some embodiments, the buffer layer is a polymer layer which is made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

As illustrated in FIG. 1, a redistribution structure 106 (or interconnection structure) is formed over the carrier 102. In some embodiments, the carrier 102 includes a plurality of package regions PKR, and the redistribution structure 106 is formed over each of the package regions PKR of the carrier 102. Furthermore, in some embodiments, the redistribution structure 106 is formed on the debond layer 104 over the carrier 102, and the formation of the redistribution structure 106 includes sequentially forming one or more dielectric layers 106A and one or more conductive layers 106B alternately stacked. The numbers of the dielectric layers 106A and the conductive layer 106B included in the redistribution structure 106 is not limited thereto, and may be designated and selected based on demand. For example, the numbers of the dielectric layers 106A and the conductive layers 106B may be one or more than one. In some embodiments, the redistribution structure 106 may have ten dielectric layers 106A and ten conductive layers 106B alternately stacked, and a thickness less than about 70 nanometers (nm).

In certain embodiments, the material of the dielectric layers 106A is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 106A is formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 106B is made of conductive materials formed by electroplating or deposition, such as aluminum, titanium, copper, nickel, tungsten, and/or alloys thereof, which may be patterned using a photolithography and etching process. In some embodiments, the conductive layer 106B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
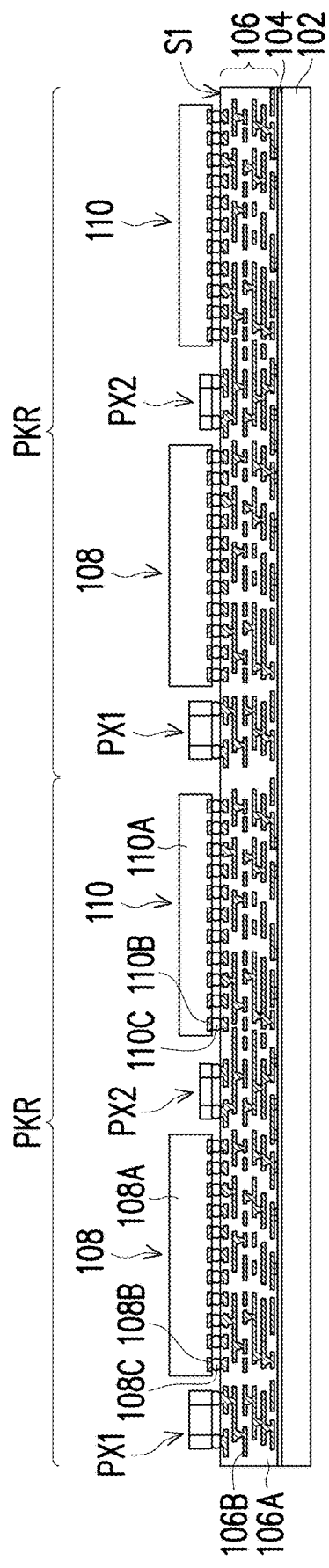

Referring to FIG. 2, after forming the redistribution structure 106, a plurality of first semiconductor dies 108 and a plurality of second semiconductor dies 110 are placed on a first surface S1 of the redistribution structure 106 over the package regions PKR. The first semiconductor dies 108 may have a surface area larger than that of the second semiconductor dies 110. Also, in some embodiments, the first semiconductor dies 108 and the second semiconductor dies 110 may be of different sizes, including different surface areas and/or different thicknesses. Although two semiconductor dies (108/110) are illustrated to be disposed on each of the package regions PKR, it should be noted that the number, sizes and types of the semiconductor dies disposed in each of the package regions PKR may be appropriately adjusted based on product requirement.

In some embodiments, the first semiconductor dies 108 and the second semiconductor dies 110 may include chip(s) of the same type or different types. For example, the first semiconductor dies 108 and the second semiconductor dies 110 may be digital chips, analog chips, or mixed signal chips, such as application-specific integrated circuit ("ASIC") chips, sensor chips, wireless and radio frequency (RF) chips, memory chips, logic chips, voltage regulator chips, or a combination thereof. In some embodiments, at least one of the first semiconductor dies 108 and the second semiconductor dies 110 is a wireless fidelity (Wi-Fi) chip simultaneously including both of a RF chip and a digital chip. The disclosure is not limited thereto.

As illustrated in FIG. 2, the first semiconductor dies 108 includes a body 108A and connecting pads 108B formed on an active surface of the body 108A. In certain embodiments, the connecting pads 108B may further include pillar structures for bonding the first semiconductor dies 108 to other structures. In some embodiments, the second semiconductor dies 110 include a body 110A and connecting pads 110B formed on an active surface of the body 110A. In other embodiments, the connecting pads 110B may further include pillar structures for bonding the second semiconductor dies 110 to other structures.

In some embodiments, the first semiconductor dies 108 and the second semiconductor dies 110 are attached to the first surface S1 of the redistribution structure 106, for example, through flip-chip bonding by way of the conductive bumps 108C and 110C. Through a reflow process, the conductive bumps 108C and 110C are formed between the connecting pads 108B, 110B and conductive layers 106B, electrically and physically connecting the first and second semiconductor dies 108, 110 to the conductive layers 106B of the redistribution structure 106.

In some embodiments, a plurality of passive components (PX1, PX2) is further disposed on the redistribution structure 106 aside the first semiconductor dies 108. For example, a first passive component PX1 and a second passive component PX2 are disposed on two sides of the first semiconductor dies 108. In some embodiments, the passive components (PX1, PX2) may be mounted on the conductive layers 106B of the redistribution structure 106 through a soldering process. The disclosure is not limited thereto. Furthermore, the passive components (PX1, PX2) may be electrically connected to the redistribution structure 106. In certain embodiments, the passive components (PX1, PX2) are surface mount devices including passive devices such as, capacitors, resistors, inductors, combinations thereof, or the like. Although two passive components (PX1, PX2) are illustrated to be disposed on the redistribution structure 106 in each of the package regions PKR, it should be noted that the number of passive components (PX1, PX2) located on the package regions PKR are not limited thereto, and could be adjusted based on design requirements.

Figure 3:
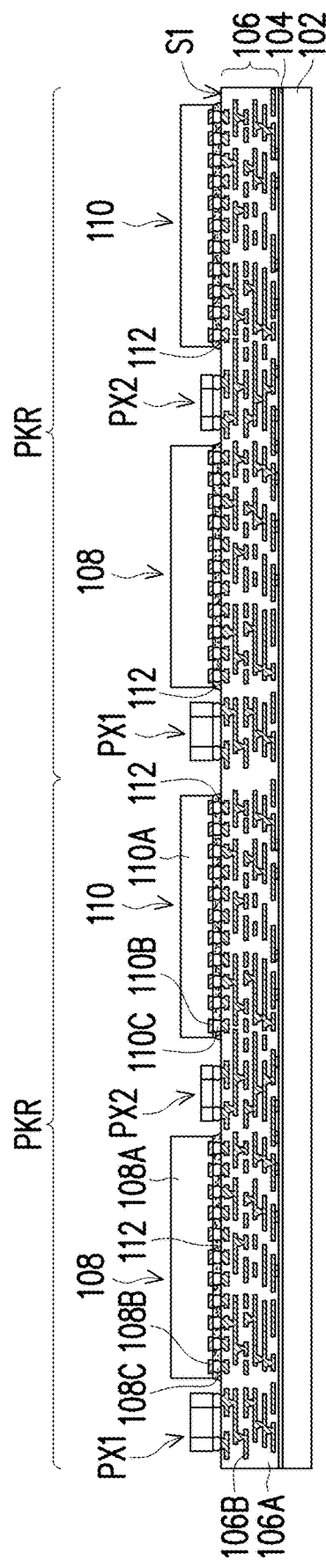

Referring to FIG. 3, in a next step, an underfill structure 112 may be formed to cover the conductive bumps 108C and 110C, to fill the spaces in between the first semiconductor dies 108 and the redistribution structure 106, and to fill the spaces in between the second semiconductor dies 110 and the redistribution structure 106. In some embodiments, the underfill structure 112 covers and surrounds the conductive bumps 108C and 110C. In certain embodiments, the underfill structure 112 is kept a distance apart from the passive components (PX1, PX2). In other words, the underfill structure 112 does not contact the passive components (PX1, PX2).

Figure 4A:
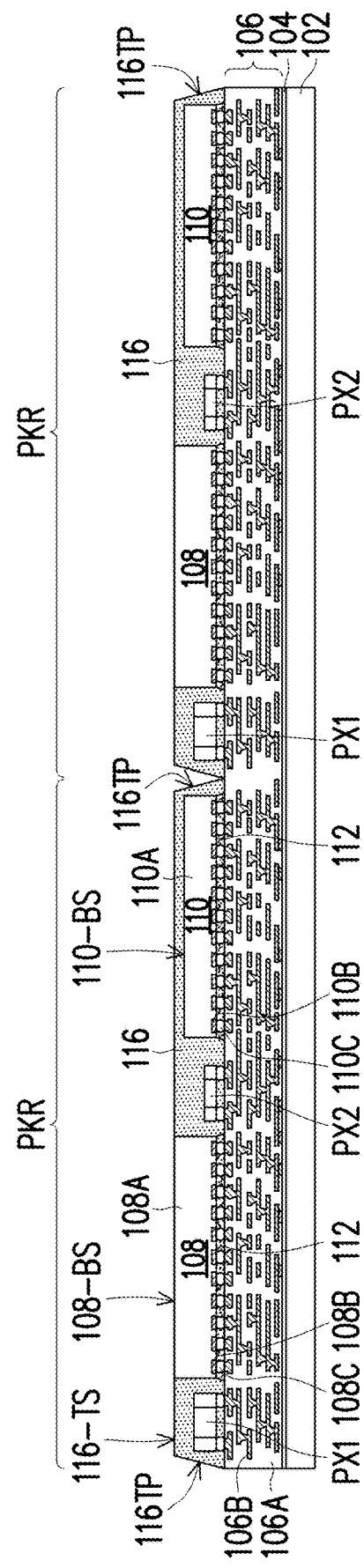

Referring to FIG. 4A, an insulating material 116 is formed on the redistribution structure 106 to encapsulate the first semiconductor dies 108 and the second semiconductor dies 110 in each of the package regions PKR. In some embodiments, the insulating material 116 further covers and encapsulate the passive components (PX1, PX2). In some embodiments, the insulating material 116 is formed through, for example, a transfer molding process or a compression molding process.

Figure 4B:
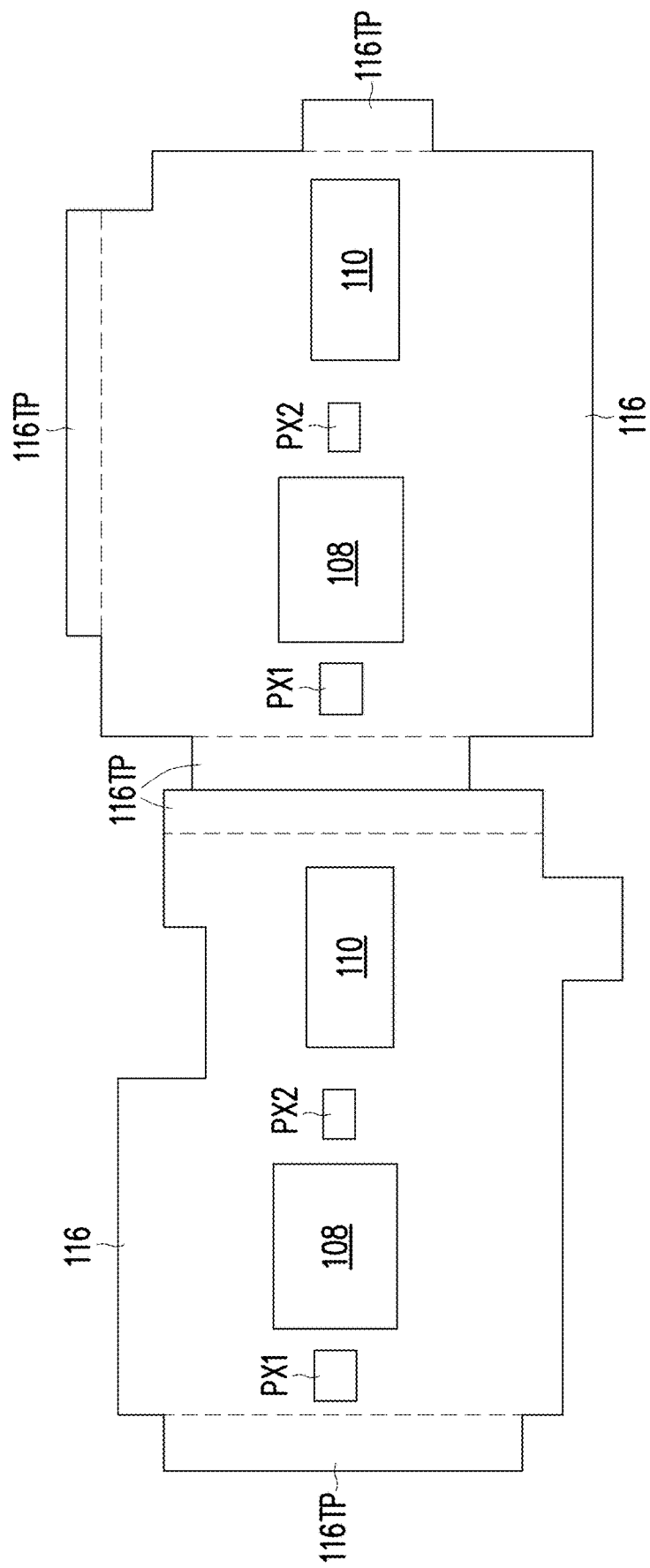

Furthermore, referring to FIG. 4B, which is a top view of the structure illustrated in FIG. 4A, in some embodiments, the insulating material 116 is formed with a polygonal conformation having irregular outline. For example, in the illustrated embodiment, the insulating material 116 may consist of a plurality of rectangles joined with one another (from the top view), and the plurality of rectangles may have different sizes. Furthermore, in some embodiments, the insulating material 116 consisting of the plurality of rectangles may or may not have rounded corners, which may be adjusted based on design requirements. In some alternative embodiments, the insulating material 116 may include other known shapes (triangle, square, rectangle, circle, trapezoid, star-shaped etc.) that form the irregular outline of the insulating material 116. The conformation or outline of the insulating material 116 in each of the package regions PKR may be the same or different, which may be adjusted based on design requirements. The insulating material 116 having the polygonal conformation may, for example, be formed by providing a mold (not shown) having such polygonal conformation/irregular outline, and injecting the insulating material 116 into the mold, followed by curing the insulating material 116 therein, and removing the mold.

In some embodiments, the insulating material 116 is formed with tapered sidewalls 116TP. In some embodiments, a top surface 116-TS of the insulating material 116 may be leveled with a backside surface 108-BS of the first semiconductor dies 108. In other words, the backside surface 108-BS of the first semiconductor dies 108 may be revealed. In certain embodiments, the top surface 116-TS of the insulating material may be covering up the backside surface 110-BS of the second semiconductor dies 110. Furthermore, a height or thickness of the insulating material 116 is not particularly limited, and may be appropriately adjusted as long as it surrounds and encapsulates the first semiconductor dies 108 and the second semiconductor dies 110.

In some embodiments, a material of the insulating material 116 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 116 includes any acceptable insulating encapsulation material. In some embodiments, the insulating material 116 may further include inorganic filler or inorganic compound (e.g. silica, clay, and so on) which can be added therein to optimize coefficient of thermal expansion (CTE) of the insulating material 116. The disclosure is not limited thereto.

After forming the insulating material 116 on the redistribution structure 106, a laser trimming process is performed to remove portions of the redistribution structure 106. For example, in some embodiments, portions of the redistribution structure 106 not covered by the insulating material 116 are removed. In other words, the redistribution structure 106 may also have the polygonal conformation/irregular outline (from top view) corresponding to that of the insulating material 116.

Figure 5A:
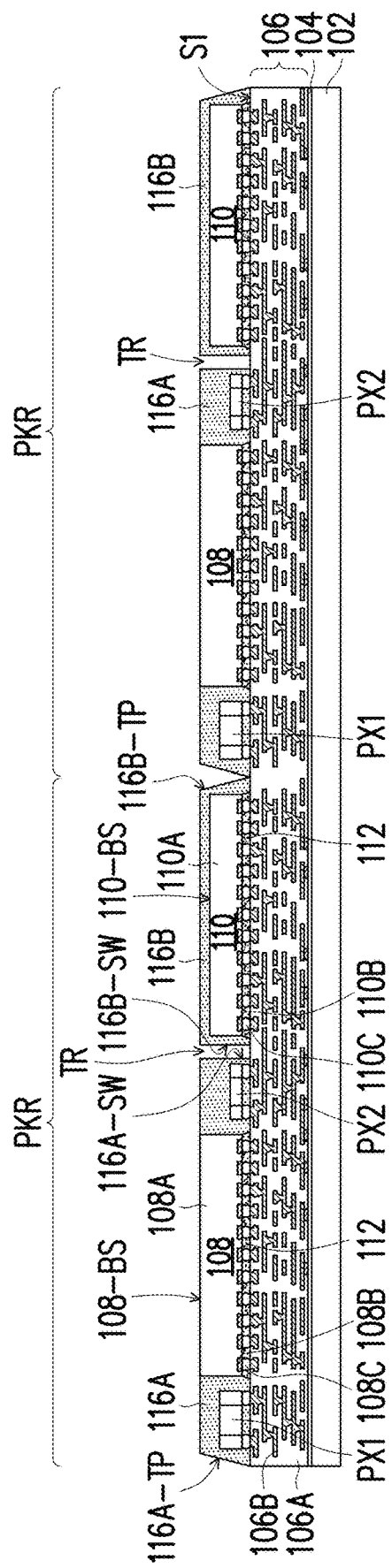
Figure 5B:
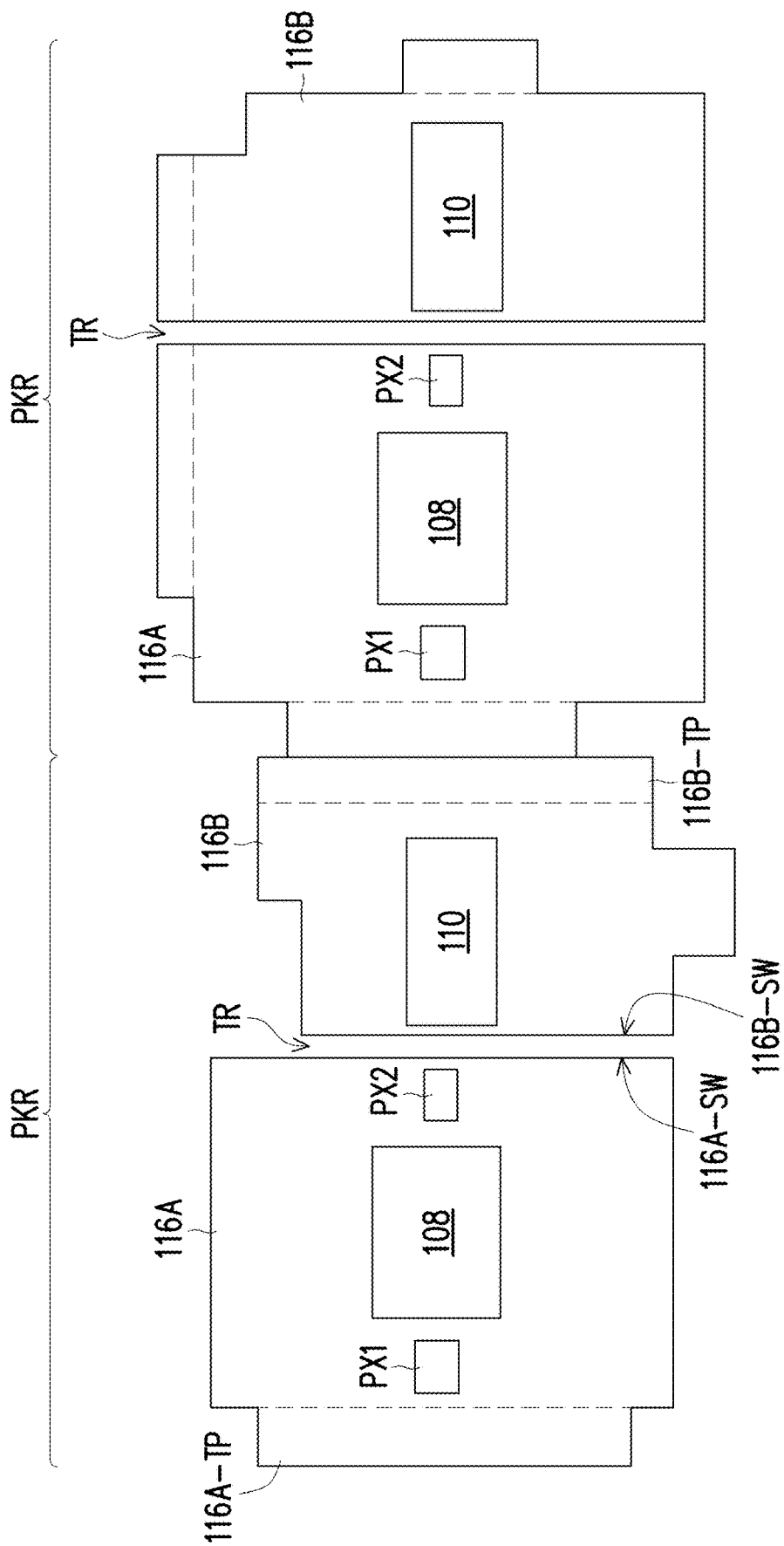

Referring to FIG. 5A, in some embodiments, portions of the insulating material 116 are removed to form a first insulating encapsulant 116A and a second insulating encapsulant 116B. For example, a trench TR is formed by removing the insulating material 116 to separate the first insulating encapsulant 116A from the second insulating encapsulant 116B. In some embodiments, the trench TR reveals the first surface S1 of the redistribution structure 106. Referring to FIG. 5B, which is a top view of the structure illustrated in FIG. 5A, the first insulating encapsulant 116A is physically separated from the second insulating encapsulant 116B by the trench TR in each of the package regions PKR. In some embodiments, the second insulating encapsulant 116B in one package region PKR is joined (at corners) with the first insulating encapsulant 116A of another package region PKR, but they are separated from one another in subsequent dicing processes.

As illustrated in both of FIG. 5A and FIG. 5B, in some embodiments, the first insulating encapsulant 116A has at least one tapered sidewall 116A-TP, and a sidewall 116A-SW that is perpendicular to the first surface S1 of the redistribution structure 106. The tapered sidewall 116A-TP and the sidewall 116A-SW are located on two opposing sides of the first insulating encapsulant 116A. Similarly, in some embodiments, the second insulating encapsulant 116B has at least one tapered sidewall 116B-TP and a sidewall 116B-SW that is perpendicular to the first surface S1 of the redistribution structure 106. The tapered sidewall 116B-TP and the sidewall 116B-SW are located on two opposing sides of the second insulating encapsulant 116B. In certain embodiments, the tapered sidewall 116A-TP of the first insulating encapsulant 116A is facing the tapered sidewall 116B-TP of the second insulating encapsulant 116B. In some embodiments, the first insulating encapsulant 116A is encapsulating the first semiconductor die 108 and the passive components (PX1, PX2). In certain embodiments, the second insulating encapsulant 116B is encapsulating the second semiconductor die 110. Furthermore, the first insulating encapsulant 116A and the second insulating encapsulant 116B may both have polygonal conformation/irregular outline (from top view), which may be adjusted based on the shape of the insulating material 116.

Figure 6A:
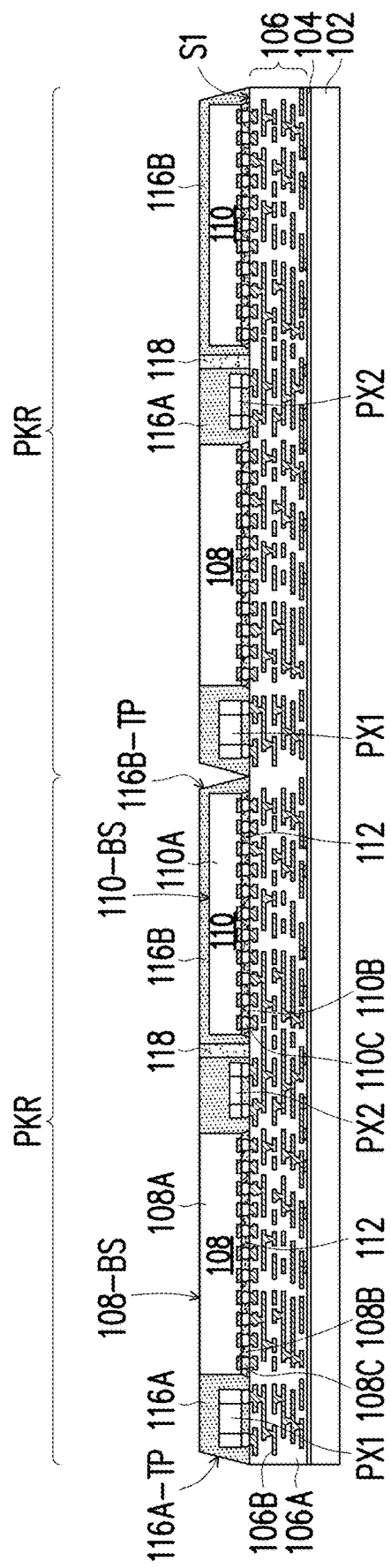
Figure 6B:
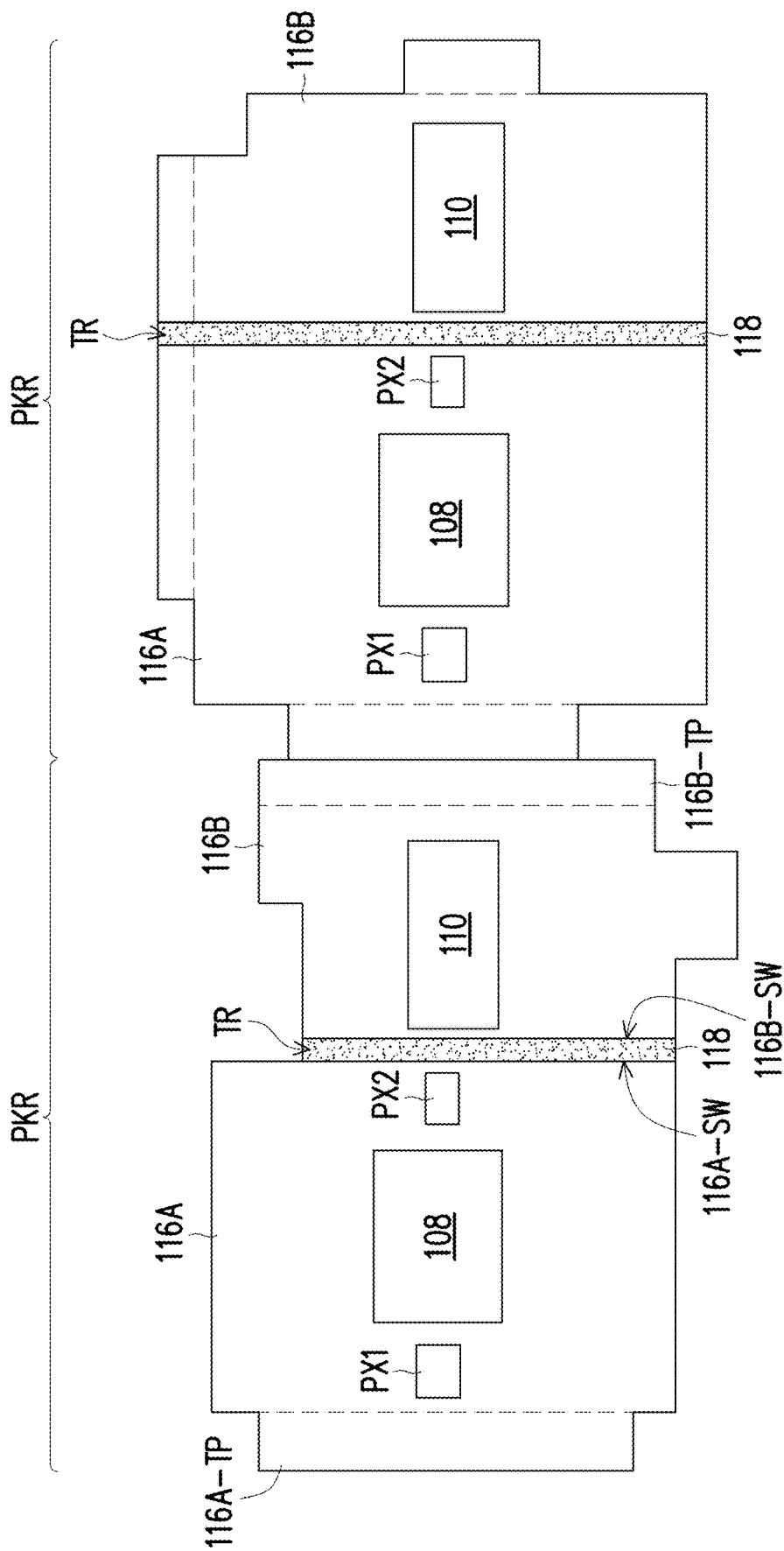

Referring to FIG. 6A, after forming the first insulating encapsulant 116A and the second insulating encapsulant 116B, a compartment shielding structure 118 may be formed to fill the trench TR. For example, the compartment shielding structure 118 may be selectively formed between the first insulating encapsulant 116A and the second insulating encapsulant 116B. Referring to FIG. 6B, which is a top view of the structure illustrated in FIG. 6A, the compartment shielding structure 118 is physically separating the first insulating encapsulant 116A from the second insulating encapsulant 116B. In some embodiments, a material of the compartment shielding structure 118 comprises silver paste. For example, the silver paste is dispensed on the redistribution structure 106 and filled into the trench TR, and subsequently cured to form the compartment shielding structure 118. However, the disclosure is not limited thereto, and other materials may be used as the compartment shielding structure 118. In some alternative embodiments, a material of the compartment shielding structure 118 include conductive materials such as copper, nickel, conductive polymers, the like, or a combination thereof.

Figure 7:
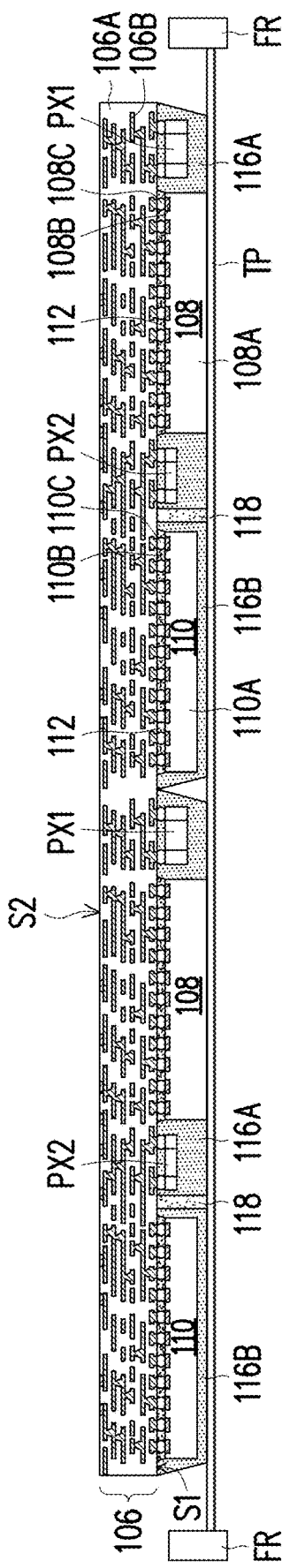

Referring to FIG. 7, in a next step, the structure shown in FIG. 6A and FIG. 6B may be turned upside down and attached to a tape TP (e.g., a dicing tape) supported by a frame FR. As illustrated in FIG. 7, the carrier 102 is debonded and is separated from the redistribution structure 106. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the package structure before de-bonding the carrier 102 and the debond layer 104. After the de-bonding process, a second surface S2 of the redistribution structure 106 is revealed or exposed.

Figure 8:
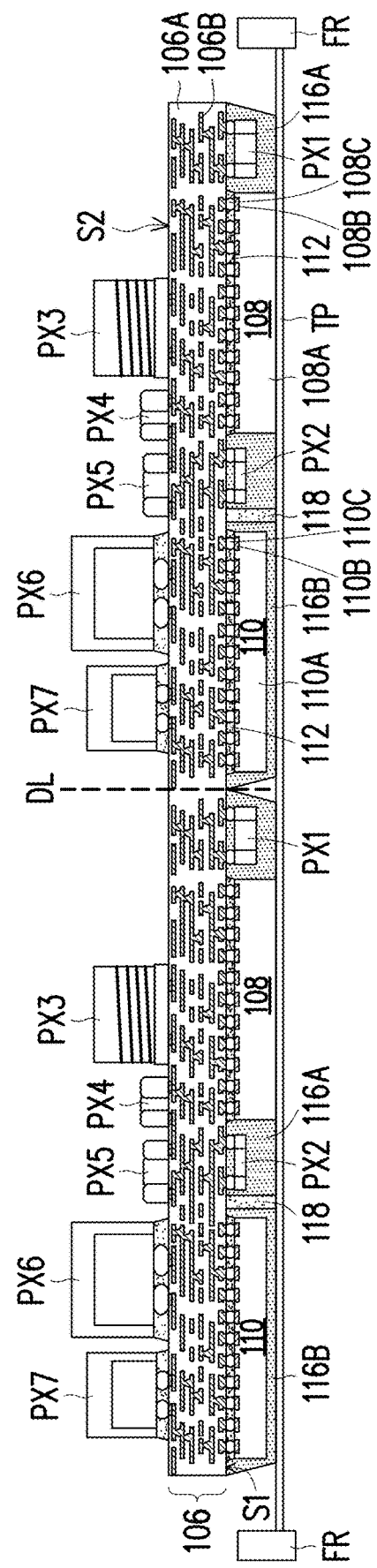

Referring to FIG. 8, after the de-bonding step, a plurality of passive components (PX3, PX4, PX5, PX6, PX7) is disposed on the second surface S2 of the redistribution structure 106. For example, a third passive component PX3, a fourth passive component PX4, a fifth passive component PX5, a sixth passive component PX6 and a seventh passive component PX7 are located side by side on the second surface S2 of the redistribution structure 106. In some embodiments, the passive components (PX3, PX4, PX5, PX6, PX7) are disposed on the redistribution structure 106 opposite to a side where the passive components (PX1, PX2) are located. In other words, passive components (PX1~PX7) are disposed on two opposing surfaces of the redistribution structure 106 (or interconnection structure).

In some embodiments, the passive components (PX3, PX4, PX5, PX6, PX7) may be mounted on the conductive layers 106B of the redistribution structure 106 through a soldering process. The disclosure is not limited thereto. Furthermore, the passive components (PX3, PX4, PX5, PX6, PX7) may be electrically connected to the redistribution structure 106. In certain embodiments, the passive components (PX3, PX4, PX5, PX6, PX7) are surface mount devices including passive devices such as, capacitors, resistors, inductors, combinations thereof, or the like. In some other embodiments, the passive components (PX3, PX4, PX5, PX6, PX7) are functional modules such as, internal measurement units, Bluetooth units, audio codec modules, or the like. Although five passive components (PX3, PX4, PX5, PX6, PX7) are illustrated to be disposed on the second surface S2 of the redistribution structure 106 in each of the package regions PKR, it should be noted that the number of passive components (PX3, PX4, PX5, PX6, PX7) located on the package regions PKR are not limited thereto, and could be adjusted based on design requirements. For example, the number of passive components disposed on the second surface S2 of the redistribution structure 106 may be one or more. In some embodiments, the passive components (PX3, PX4, PX5, PX6, PX7) and the passive components (PX1, PX2) may respectively be the same type of passive components, or are different type of passive components.

Figure 9:
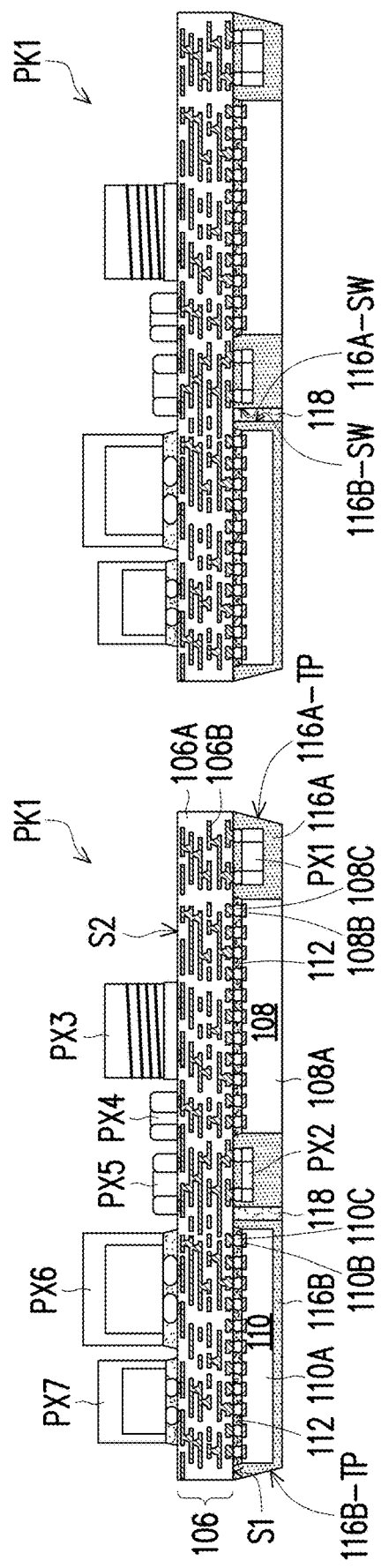

Referring to FIG. 9, after disposing the passive components (PX3, PX4, PX5, PX6, PX7) on the redistribution structure 106, the plurality of package regions PKR is separated from one another by dicing through the dicing line DL (shown in FIG. 8). For example, a dicing process is performed along the dicing line DL to cut the whole wafer structure (cutting through the redistribution structure 106 and parts of the first insulating encapsulant 116A and second insulating encapsulant 116B) to form a plurality of package structures PK1.

Figure 10:
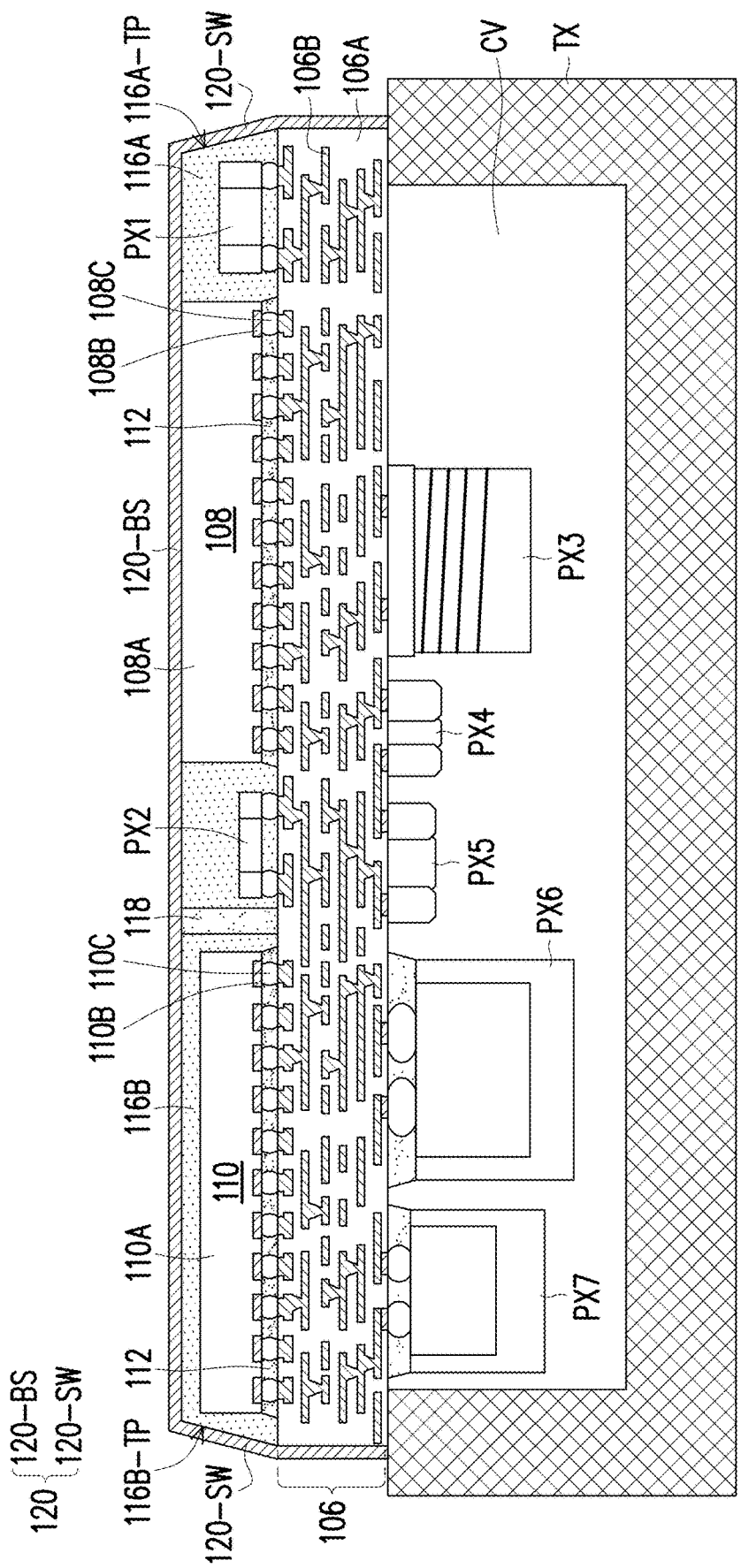

Referring to FIG. 10, in a subsequent step, the package structure PK1 illustrated in FIG. 9 is turned upside down and disposed on a tray TX. For example, the tray TX may include at least one cavity CV, and the package structure PK1 is disposed on the tray TX in way that the redistribution structure 106 is supported by the tray TX and the passive components (PX3, PX4, PX5, PX6, PX7) are located in the cavity CV. Thereafter, a global shielding structure 120 is formed over and surrounding the first insulating encapsulant 116A, the second insulating encapsulant 116B, and covering sidewalls of the redistribution structure 106. For example, the global shielding structure 120 is formed by sputtering, spraying, printing, electroplating or deposition. In some embodiments, the global shielding structure 120 includes conductive materials such as copper, aluminum, nickel, other metallic materials, or a combination thereof. In some embodiments, a material of the global shielding structure 120 is different from a material of the compartment shielding structure 118. However, the disclosure is not limited thereto. In alternative embodiments, the global shielding structure 120 and the compartment shielding structure 118 are made of the same materials (conductive materials). In the exemplary embodiment, the global shielding structure 120 may be used for electromagnetic interference (EMI) shielding, to shield the entire package structure from interference.

In some embodiments, the global shielding structure 120 includes a base portion 120-BS and sidewall portions 120-SW joined with the base portion 120-BS. In some embodiments, the base portion 120-BS is covering and contacting surfaces of the first insulating encapsulant 116A, the first semiconductor die 108, the compartment shielding structure 118, and the second insulating encapsulant 116B. In certain embodiments, the sidewall portions 120-SW are covering the tapered sidewall 116A-TP, the tapered sidewall 116B-TP and covering the sidewalls of the redistribution structure 106. Furthermore, the compartment shielding structure 118 may be joined with the global shielding structure 120 (e.g. joined with the base portion 120-BS) to define compartments in the global shielding structure 120. After removing the package structure from the tray TX, the package structure PK1' illustrated in FIG. 11 may be obtained.

Figure 11:
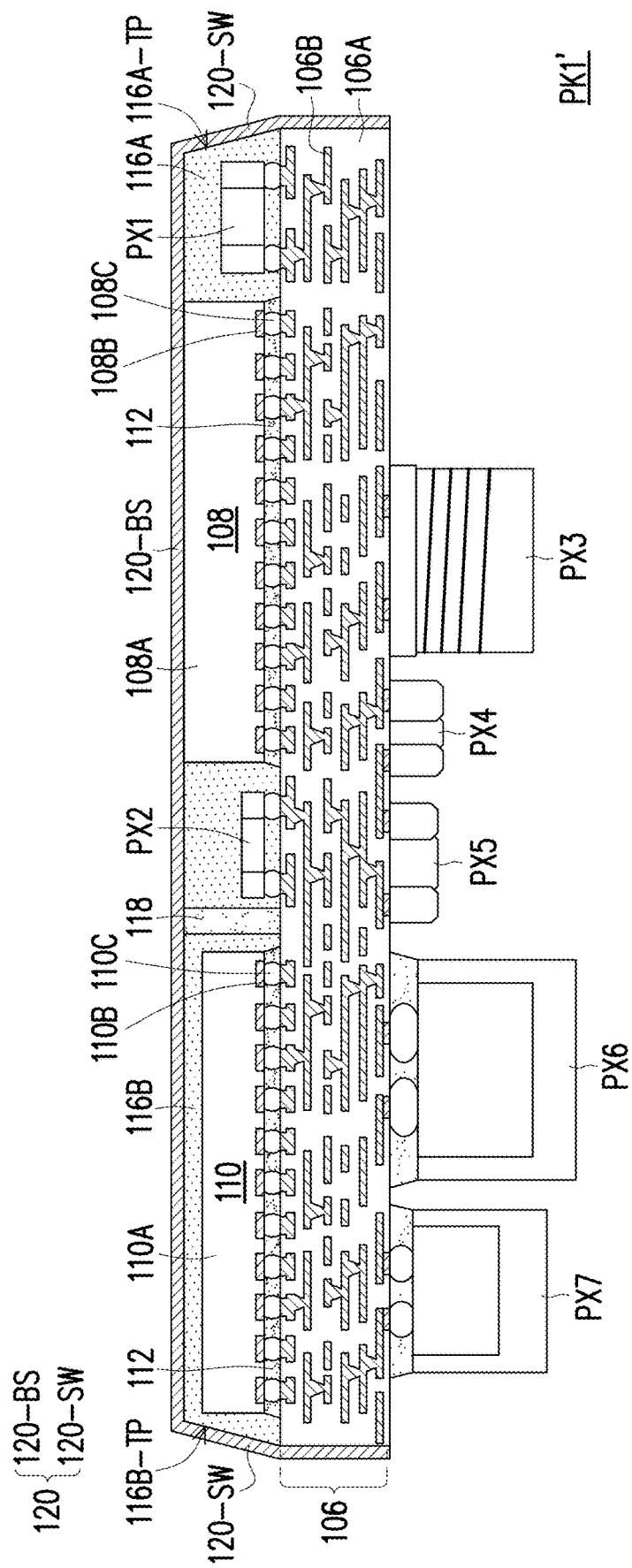
Figure 12:
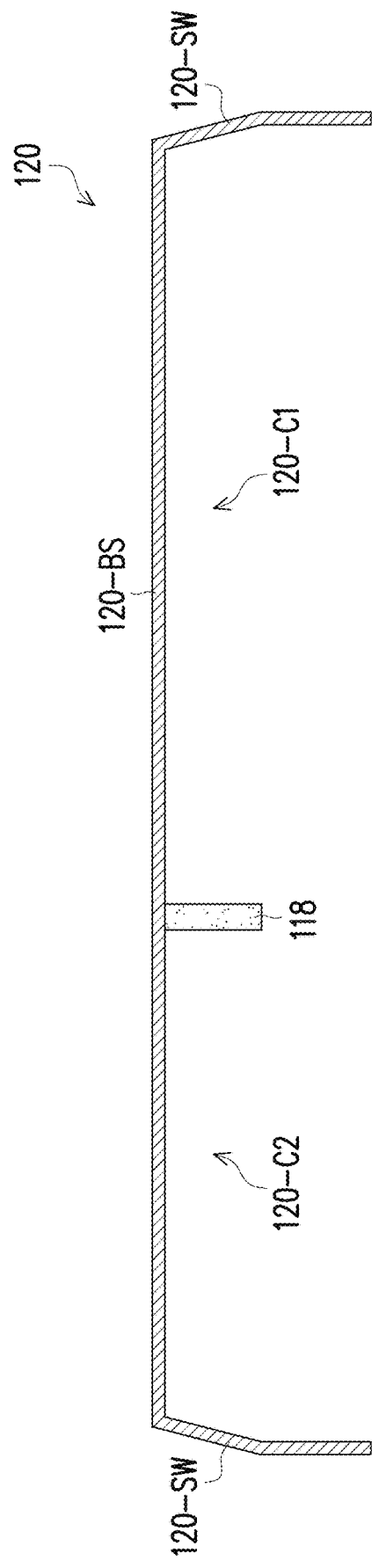
FIG. 12 is a schematic sectional view of a global shielding structure used in a package structure according to some exemplary embodiments of the present disclosure.

FIG. 12 is a schematic sectional view of a global shielding structure 120 used in the package structure PK1' according to the embodiment of FIG. 11, whereby other components are omitted for ease of illustration. The global shielding structure 120 will be described with more details by referring to FIG. 11 and FIG. 12. As illustrated in FIG. 11 and FIG. 12, in some embodiments, the global shielding structure 120 includes a first compartment 120-C1 and a second compartment 120-C2, wherein the first compartment 120-C1 is separated from the second compartment 120-C2. In the exemplary embodiment, the first compartment 120-C1 is separated from the second compartment 120-C2 by the compartment shielding structure 118.

Furthermore, in the package structure PK1', the first semiconductor die 108 is disposed in the first compartment 120-C1, and the first insulating encapsulant 116A fills into the first compartment 120-C1 to encapsulate the first semiconductor die 108 and the passive components (PX1, PX2). In some embodiments, the second semiconductor die 110 is disposed in the second compartment 120-C2, and the second insulating encapsulant 116B fills into the second compartment 120-C2 to encapsulate the second semiconductor die 110. In certain embodiments, the redistribution structure 106 (or interconnection structure) is disposed over the first compartment 120-C1 and the second compartment 120-C2, wherein sidewalls of the redistribution structure 106 (or interconnection structure) is surrounded by the global shielding structure 120.

FIG. 13 to FIG. 17 schematic sectional views of various stages in a method of fabricating a package structure according to some other exemplary embodiments of the present disclosure. The method illustrated in FIG. 13 to FIG. 17 is similar to the method illustrated in FIG. 1 to FIG. 11. Therefore, the same reference numerals are used to refer to the same or liked parts, and its detailed description will be omitted herein.

Figure 13:
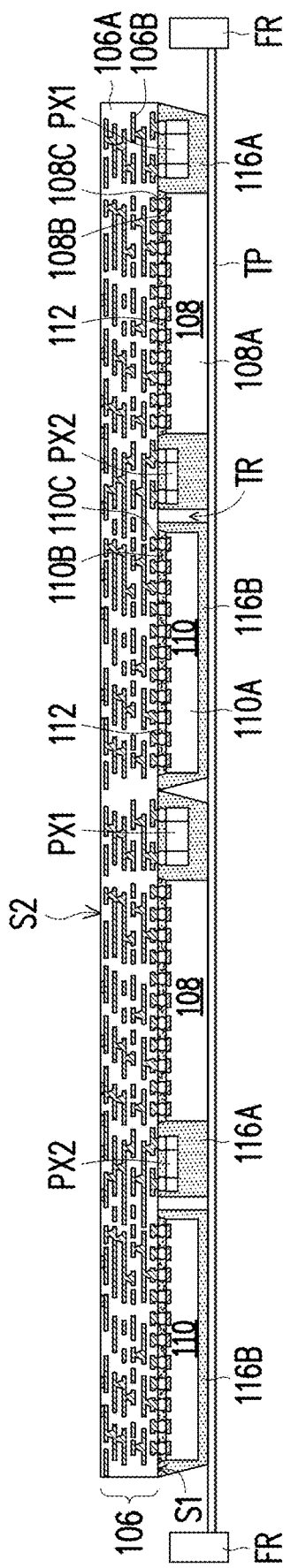
FIG. 13 to FIG. 17 schematic sectional views of various stages in a method of fabricating a package structure according to some other exemplary embodiments of the present disclosure.

In the exemplary embodiment, the same steps described in FIG. 1 to FIG. 5B are performed to form the trench TR in the insulating material 116, so that the first insulating encapsulant 116A is separated from the second insulating encapsulant 116B. However, the trench TR is not filled with any compartment shielding structure 118. Referring to FIG. 13, in a subsequent step, the structure shown in FIG. 5A and FIG. 5B may be turned upside down and attached to a tape TP (e.g., a dicing tape) supported by a frame FR. Thereafter, the carrier 102 is debonded and is separated from the redistribution structure 106, and a second surface S2 of the redistribution structure 106 is revealed or exposed.

Figure 14:
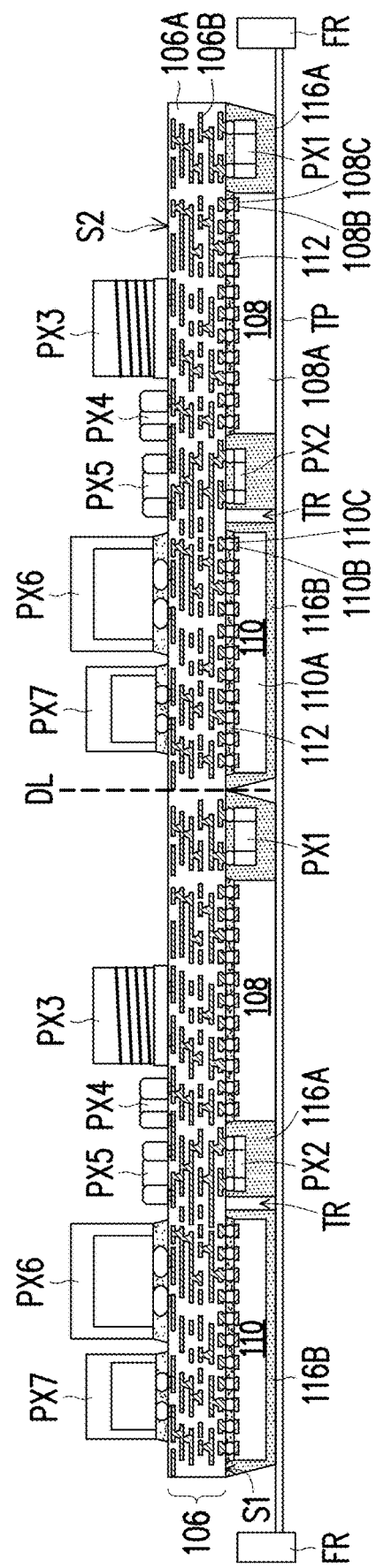
Figure 15:
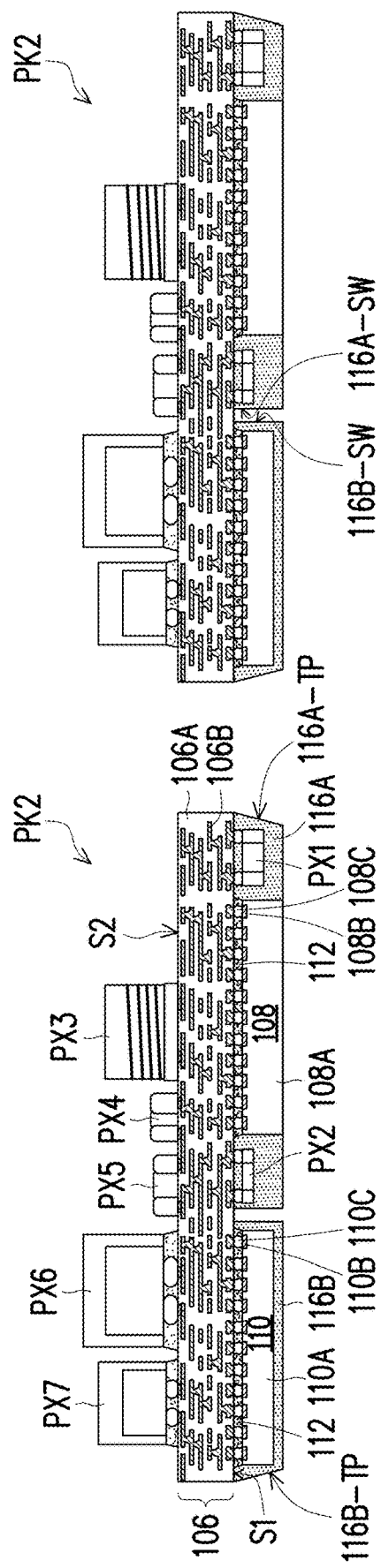

Referring to FIG. 14, a plurality of passive components (PX3, PX4, PX5, PX6, PX7) is disposed on the second surface S2 of the redistribution structure 106 in the same way as described in FIG. 8. Referring to FIG. 15, after disposing the passive components (PX3, PX4, PX5, PX6, PX7) on the redistribution structure 106, the plurality of package regions PKR is separated from one another by dicing through the dicing line DL (shown in FIG. 14). For example, a dicing process is performed along the dicing line DL to cut the whole wafer structure (cutting through the redistribution structure 106 and parts of the first insulating encapsulant 116A and second insulating encapsulant 116B) to form a plurality of package structures PK2.

Figure 16:
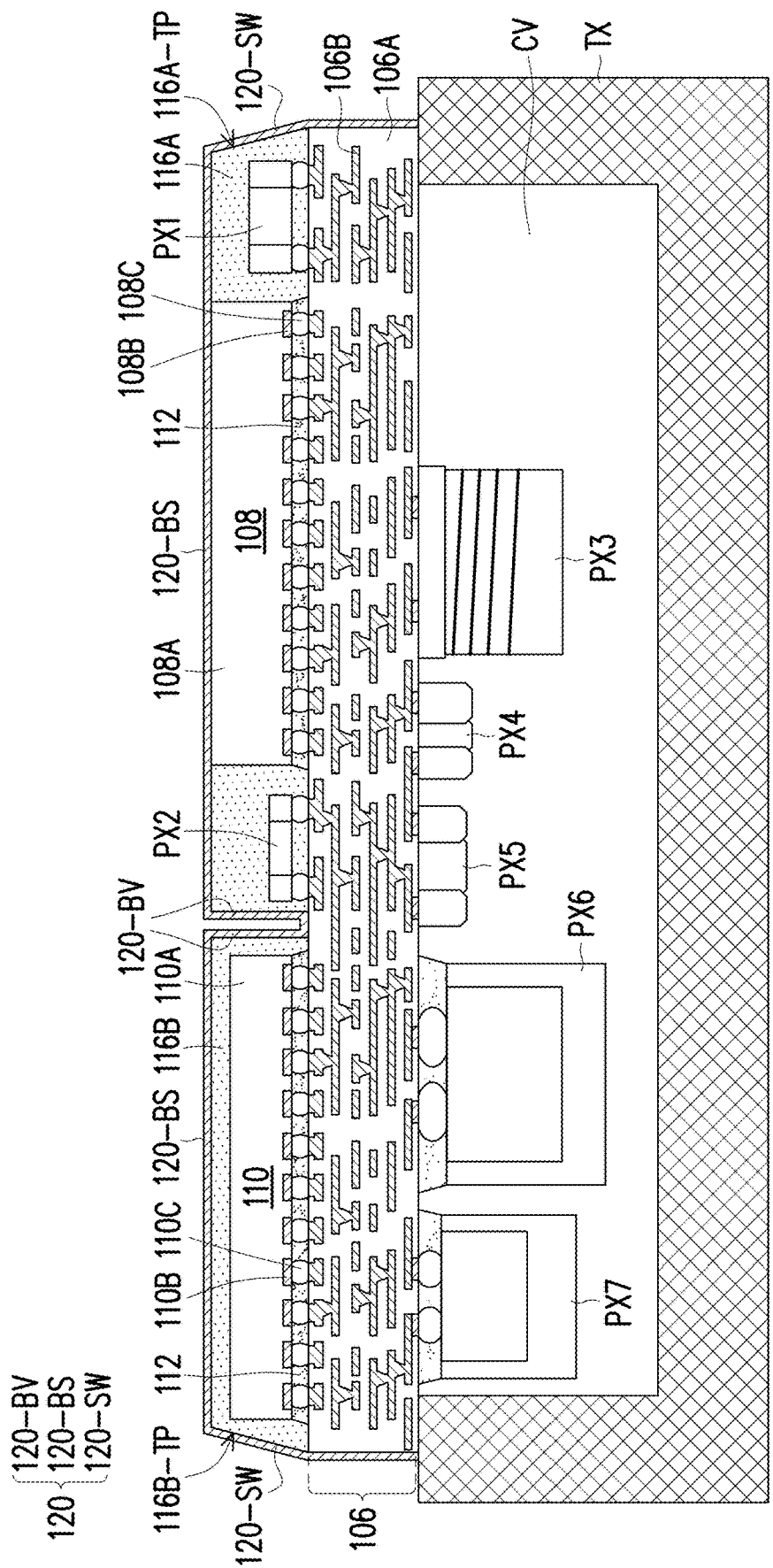

Referring to FIG. 16, in a subsequent step, the package structure PK2 illustrated in FIG. 15 is turned upside down and disposed on a tray TX. For example, the tray TX may include at least one cavity CV, and the package structure PK2 is disposed on the tray TX in way that the redistribution structure 106 is supported by the tray TX and the passive components (PX3, PX4, PX5, PX6, PX7) are located in the cavity CV. Thereafter, a global shielding structure 120 is formed over and surrounding the first insulating encapsulant 116A, the second insulating encapsulant 116B, and covering sidewalls of the redistribution structure 106.

As illustrated in FIG. 16, the global shielding structure 120 is conformally formed over the first insulating encapsulant 116A, the second insulating encapsulant 116B and within the trench TR. For example, the global shielding structure 120 includes a base portion 120-BS, sidewall portions 120-SW and a barrier portion 120-BV. In some embodiments, the base portion 120-BS is covering and contacting surfaces of the first insulating encapsulant 116A, the first semiconductor die 108 and the second insulating encapsulant 116B. In certain embodiments, the base portion 120-BS is covering backsides of the first semiconductor die 108 and the second semiconductor die 110. In some embodiments, the sidewall portions 120-SW are joined with the base portion 120-BS and surrounding the first insulting encapsulant 116A, the second insulating encapsulant 116B and the redistribution structure 106 (or interconnection structure). In certain embodiments, the barrier portion 120-BV is joined with the base portion 120-BS and surrounded by the sidewall portions 120-SW and separates the first insulating encapsulant 116A from the second insulating encapsulant 116B. After removing the package structure from the tray TX, the package structure PK2' illustrated in FIG. 17 may be obtained.

Figure 17:
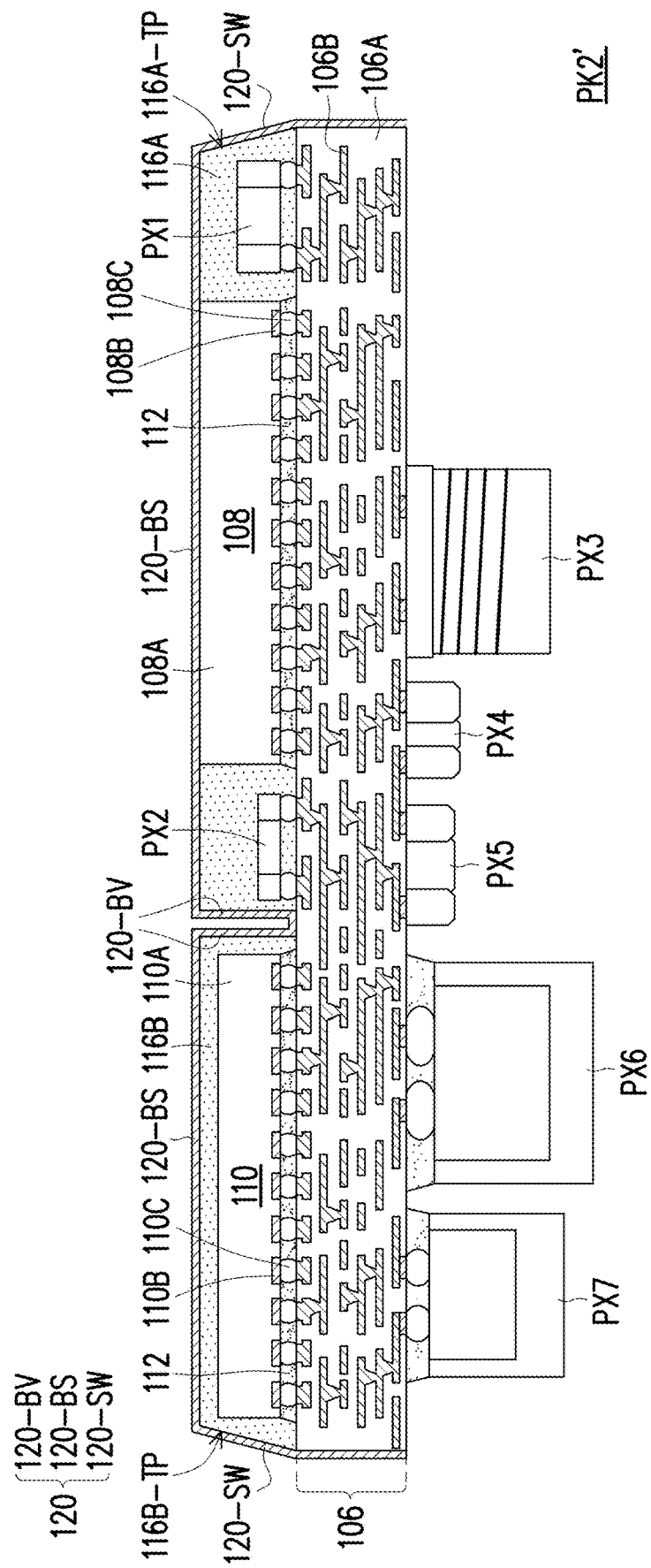
Figure 18:
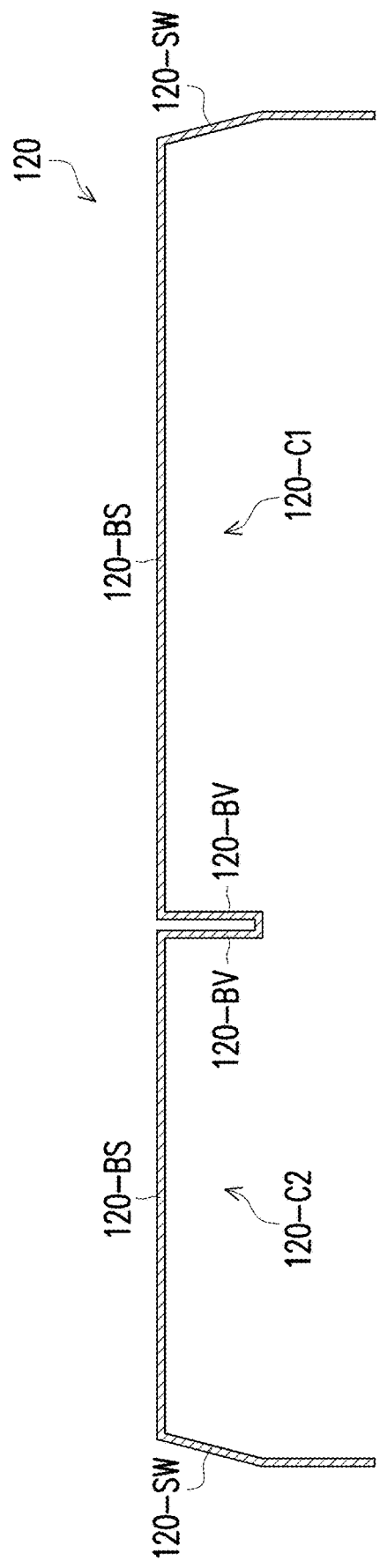
FIG. 18 is a schematic sectional view of a global shielding structure used in a package structure according to some other exemplary embodiments of the present disclosure.

FIG. 18 is a schematic sectional view of a global shielding structure 120 used in the package structure PK2' according to the embodiment of FIG. 17, whereby other components are omitted for ease of illustration. The global shielding structure 120 will be described with more details by referring to FIG. 17 and FIG. 18. As illustrated in FIG. 17 and FIG. 18, in some embodiments, the global shielding structure 120 includes a first compartment 120-C1 and a second compartment 120-C2, wherein the first compartment 120-C1 is separated from the second compartment 120-C2. In the exemplary embodiment, the first compartment 120-C1 is separated from the second compartment 120-C2 by the barrier portion 120-BV of the global shielding structure 120.

In a similar way, in the package structure PK2', the first semiconductor die 108 is disposed in the first compartment 120-C1, and the first insulating encapsulant 116A fills into the first compartment 120-C1 to encapsulate the first semiconductor die 108 and the passive components (PX1, PX2). In some embodiments, the second semiconductor die 110 is disposed in the second compartment 120-C2, and the second insulating encapsulant 116B fills into the second compartment 120-C2 to encapsulate the second semiconductor die 110. In certain embodiments, the redistribution structure 106 (or interconnection structure) is disposed over the first compartment 120-C1 and the second compartment 120-C2, wherein sidewalls of the redistribution structure 106 (or interconnection structure) is surrounded by the global shielding structure 120.

Figure 19A:
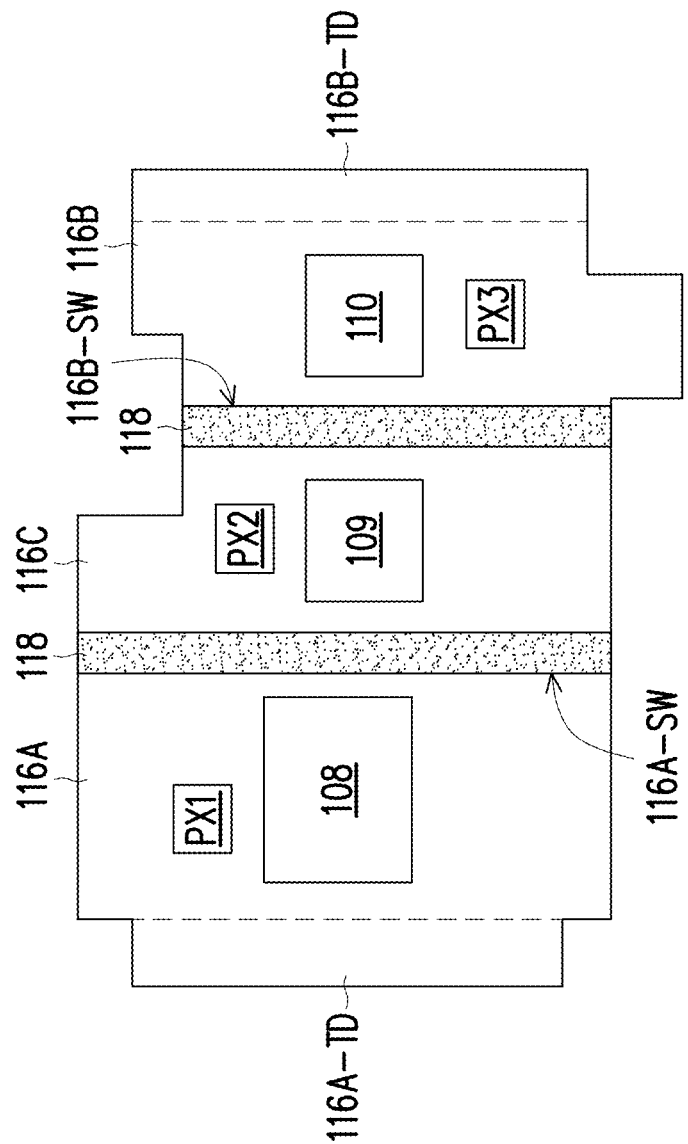
FIG. 19A to FIG. 19B are schematic sectional and top views of a package structure according to some other exemplary embodiments of the present disclosure.
Figure 19B:
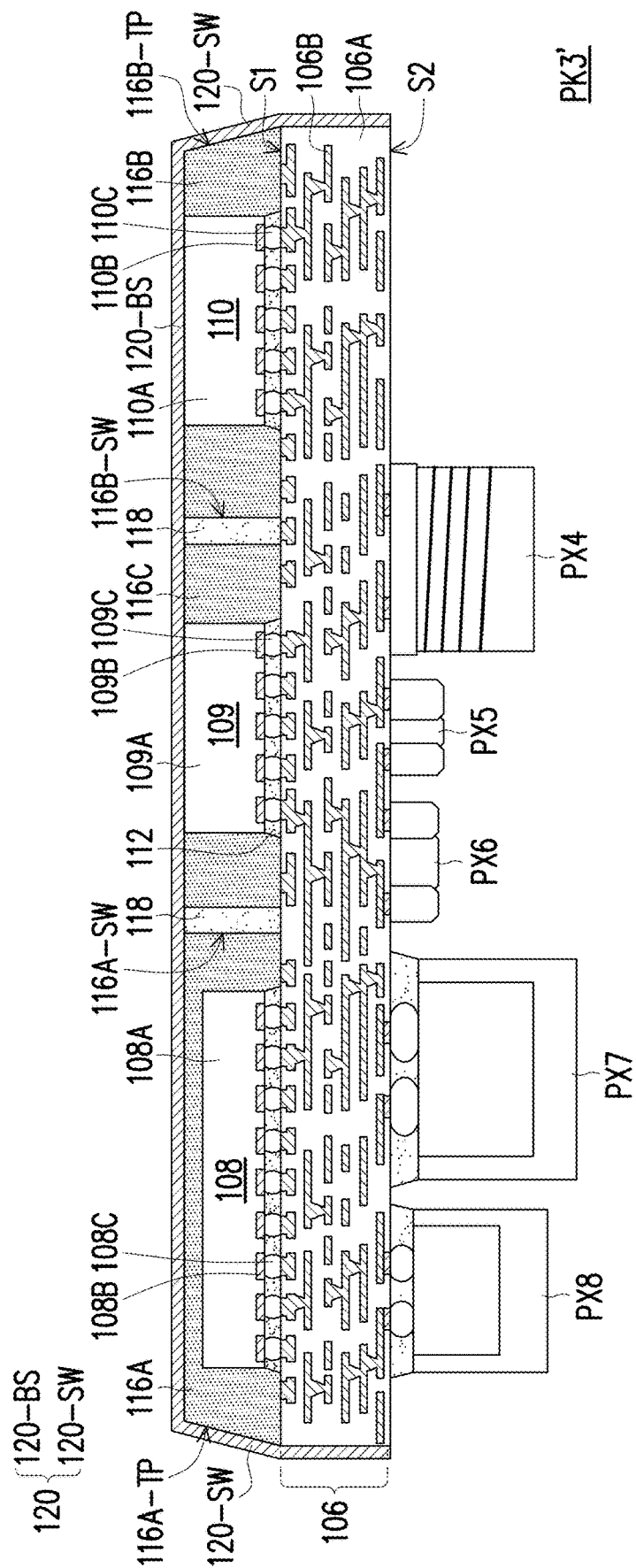

FIG. 19A to FIG. 19B are schematic sectional and top views of a package structure according to some other exemplary embodiments of the present disclosure. For example, FIG. 19A is a top view of the package structure PK3' shown in FIG. 19B with the global shield structure 120 omitted for case of illustration. The package structure PK3' illustrated in FIG. 19A and FIG. 19B is similar to the package structure PK1' illustrated in FIG. 11. Therefore, the same reference numerals are used to refer to the same or liked parts, and its detailed description will be omitted herein.

As illustrated in FIG. 19A and FIG. 19B, besides having a first semiconductor die 108 and a second semiconductor die 110, a third semiconductor die 109 may be further disposed on the first surface S1 of the redistribution structure 106. In some embodiments, the third semiconductor die 109 includes digital chips, analog chips, or mixed signal chips, such as application-specific integrated circuit ("ASIC") chips, sensor chips, wireless and radio frequency (RF) chips, memory chips, logic chips, voltage regulator chips, or a combination thereof. Furthermore, the third semiconductor die 109 includes a body 109A and connecting pads 109B formed on an active surface of the body 109A. In certain embodiments, the connecting pads 109B may further include pillar structures for bonding the third semiconductor die 109 to other structures.

In some embodiments, the third semiconductor die 109 is attached to the first surface S1 of the redistribution structure 106, for example, through flip-chip bonding by way of the conductive bump 109C. Through a reflow process, the conductive bumps 109C are formed between the connecting pads 109B and conductive layers 106B, electrically and physically connecting the third semiconductor die 109 to the conductive layers 106B of the redistribution structure 106. Furthermore, the underfill structure 112 may be formed to cover the conductive bumps 109C, to fill the spaces in between the third semiconductor dies 109 and the redistribution structure 106. In some embodiments, a plurality of passive components (PX1, PX2, PX3) is further disposed on the redistribution structure 106 aside the first semiconductor die 108, the second semiconductor die 110, and aside the third semiconductor die 109. However, the disclosure is not limited thereto, and each of the semiconductor dies (108, 109, 110) may or may not include the passive components (PX1, PX2, PX3) located aside.

Furthermore, as illustrated in FIG. 19A and FIG. 19B, a first insulating encapsulant 116A is covering and encapsulating the first semiconductor die 108 and the first passive component PX1. In some embodiments, a second insulating encapsulant 116B is covering and encapsulating the second semiconductor die 110 and the third passive component PX3. In certain embodiments, a third insulating encapsulant 116C is covering and encapsulating the third semiconductor die 109 and the second passive component PX2. In some embodiments, the first insulating encapsulant 116A, the second insulating encapsulant 116B and the third insulating encapsulant 116C are physically separated from one another. For example, a plurality of compartment shielding structure 118 is physically separating the first insulating encapsulant 116A, the second insulating encapsulant 116B and the third insulating encapsulant 116C from one another.

Figure 20:
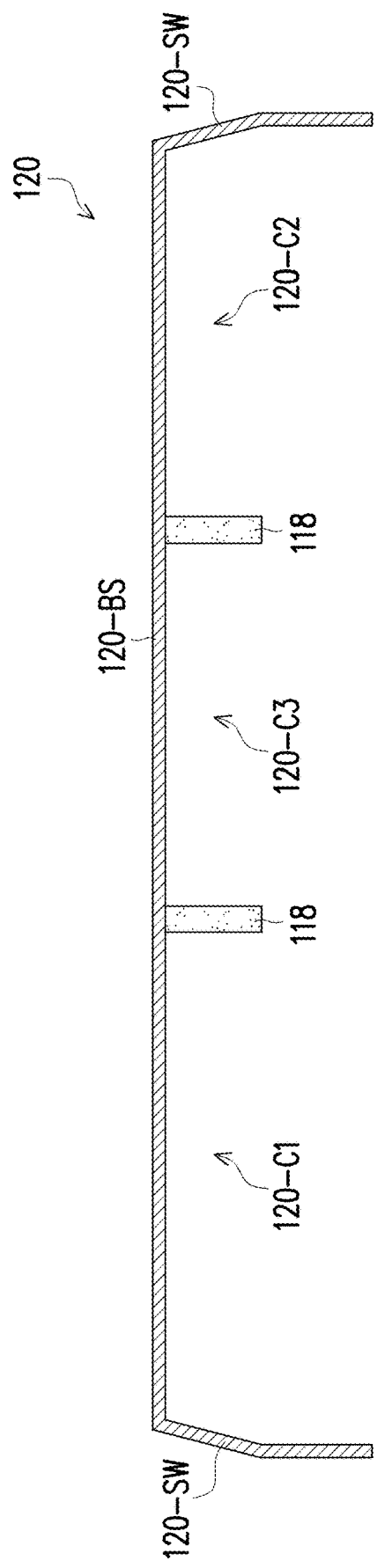
FIG. 20 is a schematic sectional view of a global shielding structure used in a package structure according to some other exemplary embodiments of the present disclosure.

FIG. 20 is a schematic sectional view of a global shielding structure 120 used in the package structure PK3' according to the embodiment of FIG. 19A and FIG. 19B, whereby other components are omitted for ease of illustration. The global shielding structure 120 will be described with more details by referring to FIG. 19A, FIG. 19B and FIG. 20. As illustrated in FIG. 19A, FIG. 19B and FIG. 20, in some embodiments, the global shielding structure 120 includes a first compartment 120-C1, a second compartment 120-C2 and a third compartment 120-C3, wherein the first compartment 120-C1, the second compartment 120-C2 and the third compartment 120-C3 are separated from one another. In the exemplary embodiment, the first compartment 120-C1, the second compartment 120-C2 and the third compartment 120-C3 are separated from one another by the compartment shielding structures 118.

Furthermore, in the package structure PK3', the first semiconductor die 108 is disposed in the first compartment 120-C1, and the first insulating encapsulant 116A fills into the first compartment 120-C1 to encapsulate the first semiconductor die 108 and the first passive component PX1. In some embodiments, the second semiconductor die 110 is disposed in the second compartment 120-C2, and the second insulating encapsulant 116B fills into the second compartment 120-C2 to encapsulate the second semiconductor die 110 and the third passive component PX3. In some embodiments, the third semiconductor die 109 is disposed in the third compartment 120-C3, and the third insulating encapsulant 116C fills into the third compartment 120-C3 to encapsulate the third semiconductor die 109 and the second passive component PX2. In certain embodiments, the redistribution structure 106 (or interconnection structure) is disposed over the first compartment 120-C1, the second compartment 120-C2 and the third compartment 120-C2, wherein sidewalls of the redistribution structure 106 (or interconnection structure) is surrounded by the global shielding structure 120.

Figure 21:
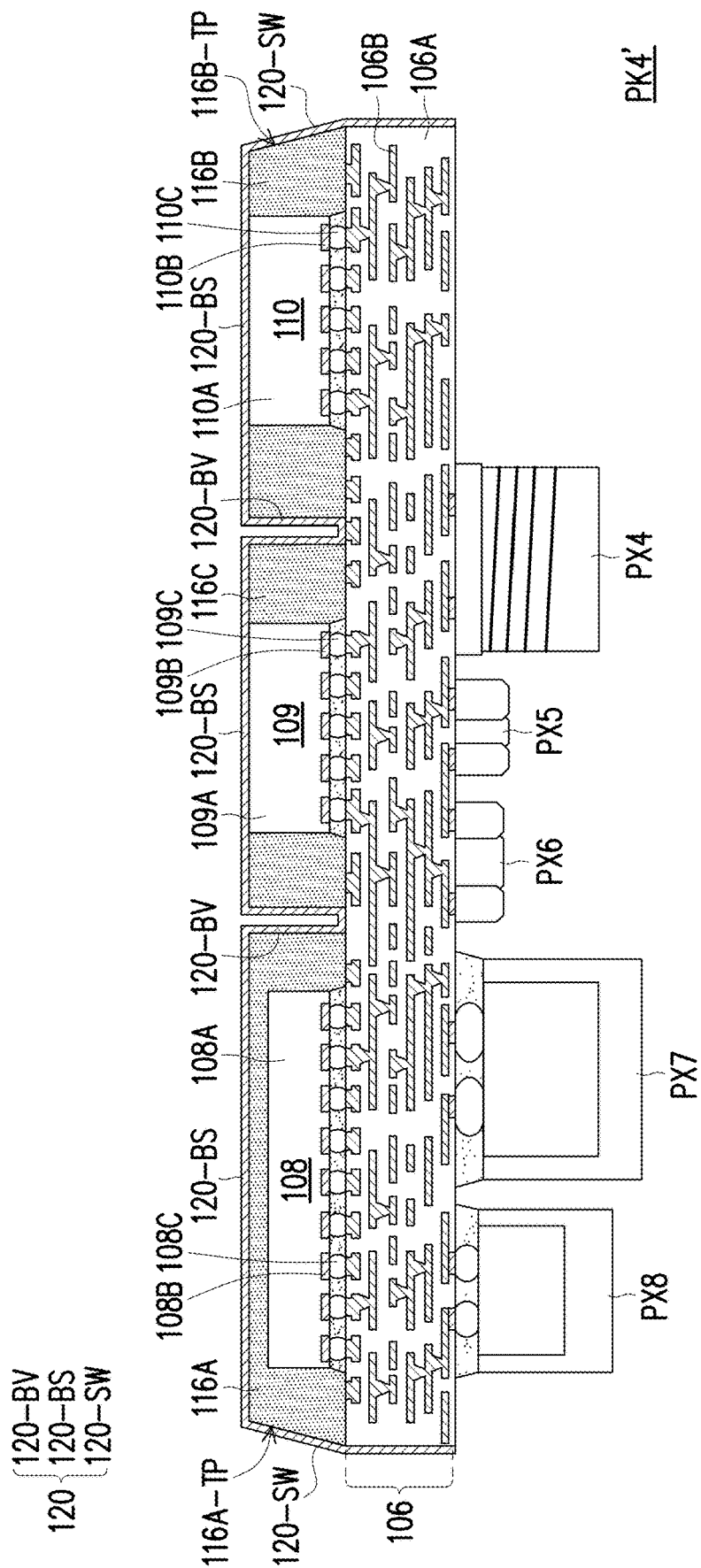
FIG. 21 is a schematic sectional view of a package structure according to some other exemplary embodiments of the present disclosure.

FIG. 21 is a schematic sectional view of a package structure according to some other exemplary embodiments of the present disclosure. The package structure PK4' illustrated in FIG. 21 is similar to the package structure PK3' illustrated in FIG. 19A and FIG. 19B. Therefore, the same reference numerals are used to refer to the same or liked parts, and its detailed description will be omitted herein.

Referring to the embodiment of FIG. 21, the compartment shielding structure 118 is omitted, and the global shielding structure 120 is conformally formed over the first insulating encapsulant 116A, the second insulating encapsulant 116B, the third insulating encapsulant 116C and within the trench TR. For example, the global shielding structure 120 includes a base portion 120-BS, sidewall portions 120-SW and a barrier portion 120-BV. In some embodiments, the base portion 120-BS is covering and contacting surfaces of the first insulating encapsulant 116A, the second insulating encapsulant 116B, the second semiconductor die 110, the third insulating encapsulant 116C and the third semiconductor die 109. In certain embodiments, the base portion 120-BS is covering backsides of the first semiconductor die 108, the second semiconductor die 110 and the third semiconductor die 109. In some embodiments, the sidewall portions 120-SW are joined with the base portion 120-BS and surrounding the first insulting encapsulant 116A, the second insulating encapsulant 116B, the third insulating encapsulant 116C, and the redistribution structure 106 (or interconnection structure). In certain embodiments, the barrier portion 120-BV is joined with the base portion 120-BS and surrounded by the sidewall portions 120-SW and separates the first insulating encapsulant 116A, the second insulating encapsulant 116B and the third insulating encapsulant 116C from one another.

Figure 22:
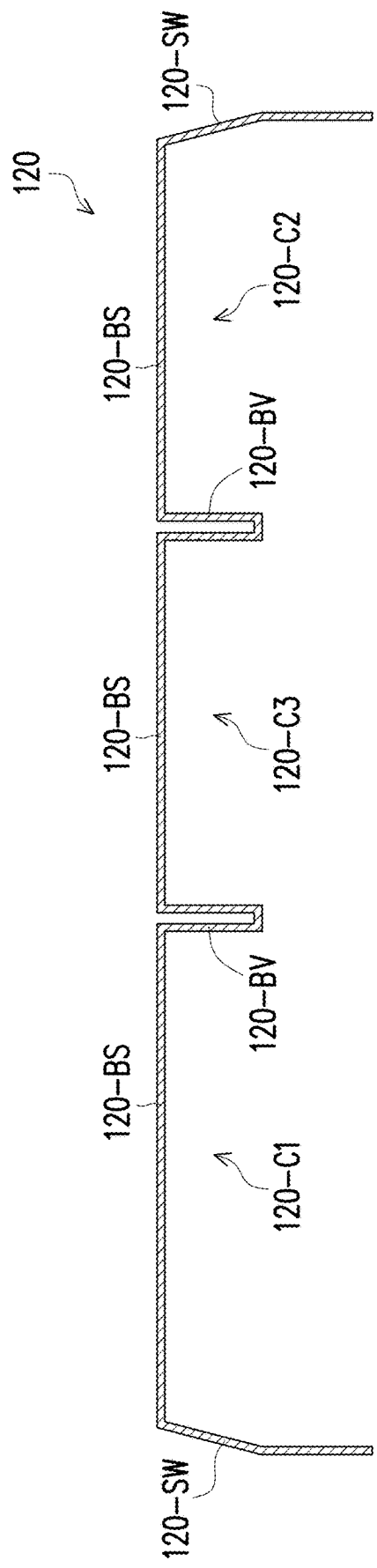
FIG. 22 is a schematic sectional view of a global shielding structure used in a package structure according to some other exemplary embodiments of the present disclosure.

FIG. 22 is a schematic sectional view of a global shielding structure 120 used in the package structure PK4' according to the embodiment of FIG. 21, whereby other components are omitted for case of illustration. The global shielding structure 120 will be described with more details by referring to FIG. 21 and FIG. 22. As illustrated in FIG. 21 and FIG. 22, in some embodiments, the global shielding structure 120 includes a first compartment 120-C1, a second compartment 120-C2 and a third compartment 120-C3, wherein the first compartment 120-C1, the second compartment 120-C2 and the third compartment 120-C3 are separated from one another. In the exemplary embodiment, the first compartment 120-C1, the second compartment 120-C2 and the third compartment 120-C3 are separated from one another by the barrier portion 120-BV of the global shielding structure 120.

Similarly, in the package structure PK4', the first semiconductor die 108 is disposed in the first compartment 120-C1, and the first insulating encapsulant 116A fills into the first compartment 120-C1 to encapsulate the first semiconductor die 108 and the first passive component PX1. In some embodiments, the second semiconductor die 110 is disposed in the second compartment 120-C2, and the second insulating encapsulant 116B fills into the second compartment 120-C2 to encapsulate the second semiconductor die 110 and the third passive component PX3. In some embodiments, the third semiconductor die 109 is disposed in the third compartment 120-C3, and the third insulating encapsulant 116C fills into the third compartment 120-C3 to encapsulate the third semiconductor die 109 and the second passive component PX2. In certain embodiments, the redistribution structure 106 (or interconnection structure) is disposed over the first compartment 120-C1, the second compartment 120-C2 and the third compartment 120-C2, wherein sidewalls of the redistribution structure 106 (or interconnection structure) is surrounded by the global shielding structure 120.

Figure 23:
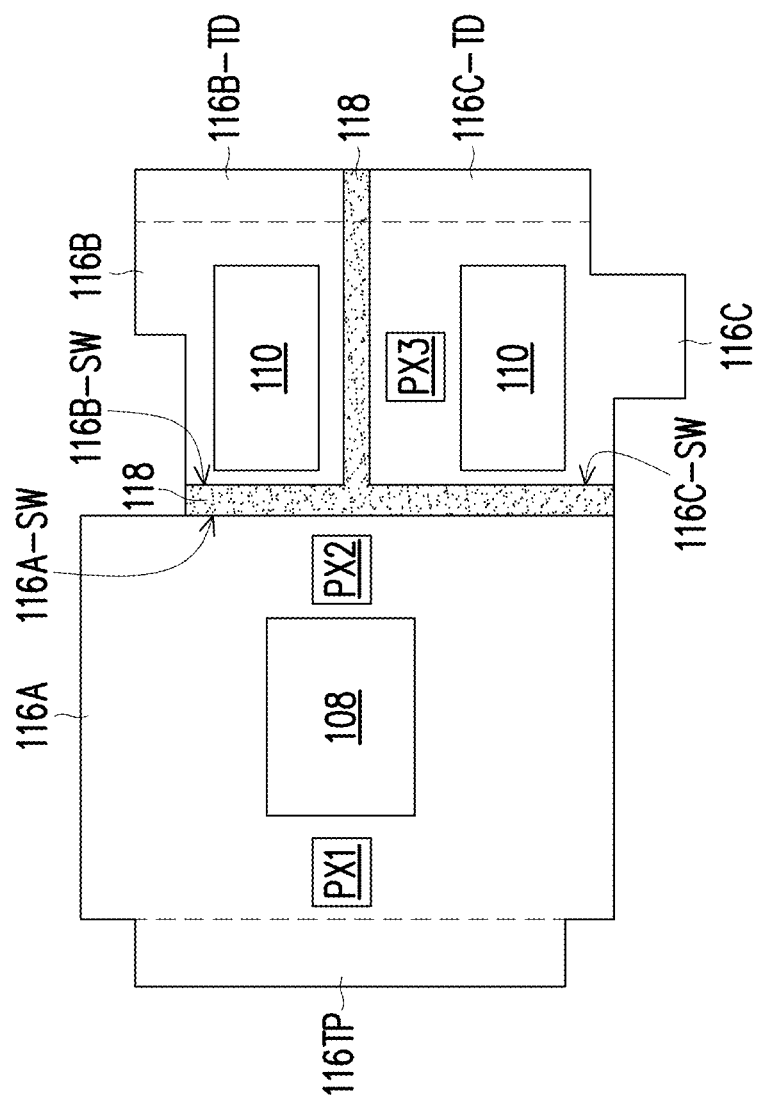
FIG. 23 is a schematic top view of a package structure according to some other exemplary embodiments of the present disclosure.

FIG. 23 is a schematic top view of a package structure according to some other exemplary embodiments of the present disclosure. The top view illustrated in FIG. 23 is similar to the top view of the package structure PK3' illustrated in FIG. 19A. Therefore, the same reference numerals are used to refer to the same or liked parts, and its detailed description will be omitted herein.

In the top view shown in FIG. 19A, the first semiconductor die 108, the second semiconductor die 110 and the third semiconductor die 109 are arranged side by side, whereby two compartment shielding structures 118 are separating the semiconductor dies (108, 109, 110) from one another. Furthermore, the third semiconductor die 109 is located in a position in between the first semiconductor die 108 and the second semiconductor die 110. However, the disclosure is not limited thereto, and the positions of the semiconductor dies (108, 109, 110) and the compartment shielding structures 118 may be rearranged based on design requirements.

For example, referring to FIG. 23, the first semiconductor die 108, the second semiconductor die 110 and the third semiconductor die 109 are also separated from one another. However, the first semiconductor die 108, the second semiconductor die 110 and the third semiconductor die 109 are separated from one another by using a single T-shaped compartment shielding structure 118. In addition, the positions of the first semiconductor die 108, the second semiconductor die 110 and the third semiconductor die 109 are also rearranged so that both the second semiconductor die 110 and the third semiconductor die 109, which occupy smaller areas, are arranged aside the first semiconductor die 108, which occupies a larger area. Furthermore, the first insulating encapsulant 116A, the second insulating encapsulant 116B and the third insulating encapsulant 116C may all have polygonal conformation/irregular outline (from top view), which may be adjusted based on design requirements. In addition, the number of passive components (PX1, PX2, PX3) located aside the first semiconductor die 108, the second semiconductor die 110 and the third semiconductor die 109 may also be adjusted based on design requirements.

In the above-mentioned embodiments, a redistribution structure is used in replacement of substrates in conventional packages for interconnection. Furthermore, the insulating encapsulant may be formed on one side of the redistribution structure by selective molding to form irregular outlines with flexible design. In addition, a compartment shielding structure is provided in between the semiconductor dies so as to minimize the interference between the dies. As such, a package structure having smaller thickness, less warpage (due to a smaller volume of the insulating encapsulants), more flexible designs and with better performance may be achieved.

In accordance with some embodiments of the present disclosure, a package structure includes a redistribution structure, a first semiconductor die, at least one first passive component, a second semiconductor die, a first insulating encapsulant, a second insulating encapsulant, at least one second passive component and a global shielding structure. The redistribution structure includes a plurality of dielectric layers and a plurality of conductive layers alternately stacked, and the redistribution structure has a first surface and a second surface opposite to the first surface. The first semiconductor die is disposed on the first surface of the redistribution structure. The first passive component is disposed on the first surface of the redistribution structure aside the first semiconductor die. The second semiconductor die is disposed on the first surface of the redistribution structure. The first insulating encapsulant is encapsulating the first semiconductor die and the at least one first passive component. The second insulating encapsulant is encapsulating the second semiconductor die, wherein the second insulating encapsulant is separated from the first insulating encapsulant. The second passive component is disposed on the second surface of the redistribution structure. The global shielding structure is surrounding the first insulating encapsulant, the second insulating encapsulant, and covering sidewalls of the redistribution structure.

In accordance with some other embodiments of the present disclosure, a package structure includes a global shielding structure, a first semiconductor die, a first insulating encapsulant, a second semiconductor die, a second insulating encapsulant, an interconnection structure and a plurality of passive components. The global shielding structure has at least a first compartment and a second compartment, wherein the first compartment is separated from the second compartment. The first semiconductor die is disposed in the first compartment. The first insulating encapsulant is filling into the first compartment and encapsulating the first semiconductor die. The second semiconductor die is disposed in the second compartment. The second insulating encapsulant is filling into the second compartment and encapsulating the second semiconductor die. The interconnection structure is disposed over the first compartment and the second compartment, wherein sidewalls of the interconnection structure is surrounded by the global shielding structure. The plurality of passive components is disposed on the interconnection structure.

In accordance with yet another embodiment of the present disclosure, a method of fabricating a package structure is described. The method includes the following steps. A redistribution structure is formed on a carrier, wherein forming the redistribution structure includes forming a plurality of dielectric layers and a plurality of conductive layers alternately stacked. A first semiconductor die and a second semiconductor die are placed on a first surface of the redistribution structure. At least one first passive component is placed on the first surface of the redistribution structure. A first insulating encapsulant and a second insulating encapsulant are formed on the first surface of the redistribution structure, wherein the first insulating encapsulant is encapsulating the first semiconductor die and the at least one first passive component, and the second insulating encapsulant is encapsulating the second semiconductor die and separated from the first insulating encapsulant. The carrier is debonded to reveal a second surface of the redistribution structure. At least one second passive component is placed on the second surface of the redistribution structure. A global shielding structure is formed to surround the first insulating encapsulant, the second insulating encapsulant, and covering sidewalls of the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a redistribution structure, comprising a first surface and a second surface;
   a first insulating encapsulant disposed on the first surface of the redistribution structure, wherein the first insulating encapsulant comprises a plurality of first sidewalls, the plurality of first sidewalls is joined together to form a first irregular outline when viewed from a top view of the structure;
   a second insulating encapsulant disposed on the first surface of the redistribution structure, and physically separated from the first insulating encapsulant, wherein the second insulating encapsulant comprises a plurality of second sidewalls, the plurality of second sidewalls is joined together to form a second irregular outline when viewed from a top view of the structure, and the second irregular outline is different from the first irregular outline; and
   a shielding structure covering and contacting the redistribution structure, the first insulating encapsulant and the second insulating encapsulant.

2. The structure according to claim 1, wherein a number of the plurality of first sidewalls is more than four, and a number of the plurality of second sidewalls.

3. The structure according to claim 1, wherein the plurality of first sidewalls includes a tapered first sidewall, and the plurality of second sidewalls includes a tapered second sidewall.

4. The structure according to claim 1, further comprising a first semiconductor die embedded in the first insulating encapsulant, and a second semiconductor die embedded in the second insulating encapsulant, wherein the first semiconductor die and the second semiconductor die are electrically connected to the redistribution structure through a plurality of conductive bumps.

5. The structure according to claim 4, further comprising an underfill structure directly contacting the first surface of the redistribution structure and covering the plurality of conductive bumps.

6. The structure according to claim 1, further comprising a first passive device disposed on the first surface of the redistribution structure, and a second passive device disposed on the second surface of the redistribution structure, wherein the first passive device and the second passive device are electrically connected to the redistribution structure.

7. The structure according to claim 1, further comprising a silver paste disposed on the shielding structure and physically separating the first insulating encapsulant from the second insulating encapsulant.

8. A structure, comprising:
   a global shielding structure comprising a plurality of compartments;
   a first passive device disposed in one of the plurality of compartments of the global shielding structure;
   a plurality of insulating encapsulants filled into the plurality of compartments and covering the first passive device, wherein the plurality of insulating encapsulants includes at least a tapered sidewall, and the global shielding structure is covering the tapered sidewall;
   a redistribution structure disposed in the global shielding structure over the plurality of compartments, and covering and electrically connected to the first passive device, wherein a top surface of the redistribution structure is revealed by the global shielding structure; and
   a second passive device disposed on the top surface of the redistribution structure and electrically connected to the redistribution structure.

9. The structure according to claim 8, further comprising a third passive device disposed in another one of the plurality of compartments of the global shielding structure, wherein the plurality of compartments is isolated from one another.

10. The structure according to claim 8, wherein the second passive device is disposed to be overlapped with first passive device in a thickness direction of the redistribution structure.

11. The structure according to claim 8, wherein the plurality of compartments includes a first compartment, a second compartment and a third compartment that are physically separated from one another by a plurality of compartment shielding structures.

12. The structure according to claim 11, wherein the plurality of compartment shielding structures is made of silver paste.

13. The structure according to claim 8, wherein the plurality of insulating encapsulants includes a first insulating encapsulant, a second insulating encapsulant and a third insulating encapsulant that are physically separated from one another.

14. The structure according to claim 13, wherein the global shielding structure is further covering and contacting a backside surface of the plurality of insulating encapsulants, and covering and contacting sidewalls of the redistribution structure.

15. A structure, comprising:
   an interconnection structure;
   a first semiconductor die bonded to a first side of the interconnection structure through a plurality of first conductive bumps;
   a second semiconductor die bonded to the first side of the interconnection structure through a plurality of second conductive bumps;
   a global shielding structure comprising a base portion and sidewall portions joined with the base portion, wherein the sidewall portions include a beveled section joined with the base portion and a linear section joined with the beveled section, the linear section of the sidewall portions is laterally surrounding the interconnection structure, the beveled section of the sidewall portions is surrounding the first semiconductor die and the second semiconductor die, and wherein a backside surface of the first semiconductor die is spaced apart from the base portion of the global shielding structure, and a backside surface of the second semiconductor die is in contact with the base portion of the global shielding structure; and a plurality of passive devices bonded to a second side of the interconnection structure.

16. The structure according to claim 15, further comprising:
a first insulating encapsulant encapsulating the first semiconductor die and covering and contacting the backside surface of the first semiconductor; and
a second insulating encapsulant encapsulating the second semiconductor die, wherein the second insulating encapsulant is physically separated from the first insulating encapsulant.

17. The structure according to claim 16, wherein the first insulating encapsulant and the second insulating encapsulant has tapered sidewalls.

18. The structure according to claim 15, further comprising:
a first underfill structure, contacting the first side of the interconnection structure and surrounding the plurality of first conductive bumps;
a second underfill structure, contacting the first side of the interconnection structure and surrounding the plurality of second conductive bumps; and
a third underfill structure, contacting the second side of the interconnection structure and surrounding conductive bumps of one of the plurality of passive devices.

19. The structure according to claim 15, further comprising a third semiconductor die bonded to the first side of the interconnection structure through a plurality of third conductive bumps, wherein a backside surface of the third semiconductor die is in direct contact with the global shielding structure.

20. The structure according to claim 15, further comprising a first compartment shielding structure and a second compartment shielding structure attached to the global shielding structure, and separating the first semiconductor die and the second semiconductor die, wherein a length of the first compartment shielding structure is different from a length of the second compartment shielding structure.

* * * * *